United States Patent
Kim et al.

(10) Patent No.: US 11,705,057 B2
(45) Date of Patent: Jul. 18, 2023

(54) PIXEL AND DISPLAY APPARATUS HAVING THE SAME

(71) Applicant: Samsung Display Co., Ltd., Yongin-Si (KR)

(72) Inventors: Keunwoo Kim, Seongnam-si (KR); Meejae Kang, Suwon-si (KR); Hanbit Kim, Seoul (KR); Do Kyeong Lee, Yongin-si (KR); Jaehwan Chu, Hwaseong-si (KR)

(73) Assignee: SAMSUNG DISPLAY CO., LTD., Gyenggi-Do (KR)

( * ) Notice: Subject to any disclaimer, the term of this patent is extended or adjusted under 35 U.S.C. 154(b) by 0 days.

(21) Appl. No.: 17/536,560

(22) Filed: Nov. 29, 2021

(65) Prior Publication Data
US 2022/0246087 A1    Aug. 4, 2022

(30) Foreign Application Priority Data

Feb. 2, 2021    (KR) .................. 10-2021-0015026

(51) Int. Cl.
*G09G 3/32* (2016.01)
*H10K 59/121* (2023.01)
(Continued)

(52) U.S. Cl.
CPC .......... *G09G 3/32* (2013.01); *H10K 59/1213* (2023.02); *H10K 59/1216* (2023.02);
(Continued)

(58) Field of Classification Search
CPC .................. G09G 3/20; G09G 3/2074; G09G 2300/0443; G09G 2320/0673;
(Continued)

(56) References Cited

U.S. PATENT DOCUMENTS

| 10,482,817 B2 | 11/2019 | Kim et al. |
| 11,355,064 B2 | 6/2022 | Jeon et al. |

(Continued)

FOREIGN PATENT DOCUMENTS

| CN | 108154846 A | 6/2018 |
| KR | 1020200015862 A | 2/2020 |

(Continued)

OTHER PUBLICATIONS

Partial European Search Report for Application No. 22154193.1-1207 dated Jun. 14, 2022 enumerating the above listed references.

*Primary Examiner* — Pegeman Karimi

(74) *Attorney, Agent, or Firm* — Cantor Colburn LLP

(57) ABSTRACT

A pixel includes a light emitting element, a driving switching element and a first compensation switching element and a second compensation switching element. The driving switching element is which applies a driving current to the light emitting element. The first compensation switching element and the second compensation switching element are connected between a control electrode of the driving switching element and an output electrode of the driving switching element. The first compensation switching element and the second compensation switching element are connected to each other in series. The driving switching element is a P-type transistor. The first compensation switching element is an N-type transistor. The second compensation switching element is a P-type transistor.

18 Claims, 13 Drawing Sheets

(51) Int. Cl.
*H01L 27/12* (2006.01)
*H01L 29/786* (2006.01)

(52) U.S. Cl.
CPC ........... *G09G 2300/0426* (2013.01); *G09G 2300/0819* (2013.01); *G09G 2300/0842* (2013.01); *G09G 2300/0861* (2013.01); *G09G 2310/0267* (2013.01); *G09G 2310/0275* (2013.01); *G09G 2320/0257* (2013.01); *G09G 2330/021* (2013.01); *H01L 27/1225* (2013.01); *H01L 27/1251* (2013.01); *H01L 27/1255* (2013.01); *H01L 29/7869* (2013.01); *H01L 29/78648* (2013.01); *H01L 29/78675* (2013.01)

(58) Field of Classification Search
CPC ....... G09G 2320/0686; G09G 2360/16; G09G 3/32; G09G 2300/0426; G09G 2300/0819; G09G 2300/0842; G09G 2300/0861; G09G 2310/0267; G09G 2310/0275; G09G 2320/0257; G09G 2330/021; G09G 2300/0417; G09G 2310/0251; G09G 2310/0262; G09G 2320/045; G09G 3/3233; G09G 3/3225; G09G 3/3266; G09G 3/3275; G09G 2330/02; G06T 7/13; G06T 5/005; G06T 5/20; G06T 2207/20028; G06T 2207/20032; G06V 10/751; H10K 59/1213; H10K 59/1216; H01L 27/1225; H01L 27/1251; H01L 27/1255; H01L 29/78648; H01L 29/78675; H01L 29/7869

See application file for complete search history.

(56) References Cited

U.S. PATENT DOCUMENTS

| | | | |
|---|---|---|---|
| 2017/0337875 | A1* | 11/2017 | Jeon ..................... G09G 3/3291 |
| 2018/0158417 | A1* | 6/2018 | Xiang .................. G09G 3/3258 |
| 2018/0226023 | A1 | 8/2018 | Park et al. |
| 2019/0181211 | A1* | 6/2019 | Bae ..................... H01L 27/3276 |
| 2021/0264862 | A1* | 8/2021 | Wang .................. G09G 3/3233 |
| 2021/0319747 | A1 | 10/2021 | Jeon et al. |
| 2022/0139307 | A1* | 5/2022 | Zhang .................. G09G 3/3233 |
| | | | 345/204 |
| 2022/0157223 | A1* | 5/2022 | Wang ....................... G09G 3/32 |

FOREIGN PATENT DOCUMENTS

| | | |
|---|---|---|
| KR | 1020200019306 A | 2/2020 |
| KR | 1020200032628 A | 3/2020 |
| KR | 1020200087711 A | 7/2020 |
| KR | 1020200108146 A | 9/2020 |

* cited by examiner

PIXEL AND DISPLAY APPARATUS HAVING THE SAME

This application claims priority to Korean Patent Application No. 10-2021-0015026, filed on Feb. 2, 2021, and all the benefits accruing therefrom under 35 U.S.C. § 119, the content of which in its entirety is herein incorporated by reference.

BACKGROUND

1. Field

Embodiments of the invention relate to a pixel and a display apparatus including the pixel. More particularly, embodiments of the invention relate to a pixel with reduced power consumption and enhanced display quality and a display apparatus including the pixel.

2. Description of the Related Art

Generally, a display apparatus includes a display panel and a display panel driver. The display panel may include a plurality of gate lines, a plurality of data lines, a plurality of emission lines and a plurality of pixels. The display panel driver may include a gate driver, a data driver, an emission driver and a driving controller. The gate driver outputs gate signals to the gate lines. The data driver outputs data voltages to the data lines. The emission driver outputs emission signals to the emission lines. The driving controller controls the gate driver, the data driver and the emission driver.

When an image displayed on the display panel is a static image or the display panel is operated in always-on mode, a driving frequency of the display panel may be decreased to reduce a power consumption.

SUMMARY

When a driving frequency of a display panel is decreased to reduce a power consumption during displaying a static image or operating in always-on mode, a display quality may be deteriorated due to a current leakage. In addition, an electric field may be concentrated in an active area of a driving switching element due to a charging of the electric field at a polyimide layer in a conventional pixel structure such that a characteristic of the driving switching element may be changed. Accordingly, a photo afterimage may be generated in a specific region of the display panel due to the change of the characteristic of the driving switching element.

Embodiments of the invention provide a pixel with reduced power consumption and enhanced display quality.

Embodiments of the invention provide a display apparatus including the pixel.

In an embodiment of a pixel according to the invention, the pixel includes a light emitting element, a driving switching element and a first compensation switching element and a second compensation switching element. In such an embodiment, the driving switching element is which applies a driving current to the light emitting element. In such an embodiment, the first compensation switching element and the second compensation switching element are connected between a control electrode of the driving switching element and an output electrode of the driving switching element. In such an embodiment, the first compensation switching element and the second compensation switching element are connected to each other in series. In such an embodiment, the driving switching element is a P-type transistor. In such an embodiment, the first compensation switching element is an N-type transistor. In such an embodiment, the second compensation switching element is a P-type transistor.

In an embodiment, the pixel may further include an initialization switching element which applies an initialization voltage to a node connected between the first compensation switching element and the second compensation switching element.

In an embodiment, the pixel may include a first pixel switching element including a control electrode connected to a first node, an input electrode connected to a second node and an output electrode connected to a third node, a second pixel switching element including a control electrode which receives a data write gate signal, an input electrode which receives a data voltage and an output electrode connected to the second node, a first third pixel switching element including a control electrode which receives a compensation gate signal, an input electrode connected to the first node and an output electrode connected to a fourth node, a second third pixel switching element including a control electrode which receives the data write gate signal, an input electrode connected to the fourth node and an output electrode connected to the third node, a fourth pixel switching element including a control electrode which receives a data initialization gate signal, an input electrode which receives a first initialization voltage and an output electrode connected to the fourth node, a fifth pixel switching element including a control electrode which receives an emission signal, an input electrode which receives a first power voltage and an output electrode connected to the second node, a sixth pixel switching element including a control electrode which receives the emission signal, an input electrode connected to the third node and an output electrode connected to an anode electrode of the light emitting element, a seventh pixel switching element including a control electrode which receives a light emitting element initialization gate signal, an input electrode which receives a second initialization voltage and an output electrode connected to the anode electrode of the light emitting element, a storage capacitor including a first electrode which receives the first power voltage and a second electrode connected to the first node and the light emitting element including the anode electrode and a cathode electrode which receives a second power voltage. In such an embodiment, the driving switching element may be the first pixel switching element. In such an embodiment, the first compensation switching element may be the first third pixel switching element. In such an embodiment, the second compensation switching element may be the second third pixel switching element.

In an embodiment, first pixel switching element, the second pixel switching element, the second third pixel switching element, the fourth pixel switching element, the fifth pixel switching element, the sixth pixel switching element and the seventh pixel switching element may be P-type transistors. In such an embodiment, the first third pixel switching element may be the N-type transistor.

In an embodiment, the first pixel switching element, the second pixel switching element, the second third pixel switching element, the fourth pixel switching element, the fifth pixel switching element, the sixth pixel switching element and the seventh pixel switching element may be polysilicon transistors. In such an embodiment, the first third pixel switching element may be an oxide transistor.

In an embodiment, during a first duration, the emission signal may have an inactive level, the data initialization gate signal may have an active level, the data write gate signal may have an inactive level and the compensation gate signal may have an active level. During a second duration subsequent to the first duration, the emission signal may have the inactive level, the data initialization gate signal may have an inactive level, the data write gate signal may have an active level and the compensation gate signal may have the active level.

In an embodiment, an active level of the emission signal may be a low level. In such an embodiment, the active level of the data initialization gate signal may be a low level. In such an embodiment, the active level of the data write gate signal may be a low level. In such an embodiment, the active level of the compensation gate signal may be a high level.

In an embodiment, the light emitting element initialization gate signal may have a phase same as a phase of the data write gate signal.

In an embodiment, during a third duration subsequent to the second duration, the emission signal may have the inactive level, the data initialization gate signal may have the inactive level, the data write gate signal may have the inactive level and the light emitting element initialization gate signal may have an active level.

In an embodiment, the light emitting element initialization gate signal may have a phase the same as a phase of the data initialization gate signal.

In an embodiment, an active area of the driving switching element may be disposed in a same layer as an active area of the second compensation switching element. In such an embodiment, the active area of the driving switching element may be disposed on a layer different from an active area of the first compensation switching element.

In an embodiment, the pixel may include a first active layer, a first gate insulating layer disposed on the first active layer, a first gate metal layer disposed on the first gate insulating layer, a second gate insulating layer disposed on the first gate metal layer, a second gate metal layer disposed on the second gate insulating layer, a first interlayer insulating layer disposed on the second gate metal layer, a second active layer disposed on the first interlayer insulating layer, a third gate insulating layer disposed on the second active layer, a third gate metal layer disposed on the third gate insulating layer and a second interlayer insulating layer disposed on the third gate metal layer. In such an embodiment, the active area of the driving switching element and the active area of the second compensation switching element may be included in the first active layer. In such an embodiment, the active area of the first compensation switching element may be included in the second active layer.

In an embodiment, a portion of the first gate metal layer and a portion of the second gate metal layer may overlap the active area of the driving switching element.

In an embodiment, the first compensation switching element may include a gate electrode, a drain electrode, a source electrode and a bottom gate electrode overlapping the gate electrode.

In an embodiment, the pixel may include a first active layer, a first gate insulating layer disposed on the first active layer, a first gate metal layer disposed on the first gate insulating layer, a second gate insulating layer disposed on the first gate metal layer, a second gate metal layer disposed on the second gate insulating layer, a first interlayer insulating layer disposed on the second gate metal layer, a second active layer disposed on the first interlayer insulating layer, a third gate insulating layer disposed on the second active layer, a third gate metal layer disposed on the third gate insulating layer and a second interlayer insulating layer disposed on the third gate metal layer. In such an embodiment, the gate electrode of the first compensation switching element may be included in the third gate metal layer. In such an embodiment, the bottom gate electrode of the first compensation switching element may be included in the second gate metal layer.

In an embodiment, the driving switching element may include a first gate electrode, a drain electrode, a source electrode and a second gate electrode.

In an embodiment of a display apparatus according to the invention, the display apparatus includes a display panel, a gate driver, a data driver and an emission driver. In such an embodiment, the display panel includes a pixel. In such an embodiment, the gate driver provides a gate signal to the pixel. In such an embodiment, the data driver provides a data voltage to the pixel. In such an embodiment, the emission driver provides an emission signal to the pixel. In such an embodiment, the pixel includes a light emitting element, a driving switching element and a first compensation switching element and a second compensation switching element. In such an embodiment, the driving switching element applies a driving current to the light emitting element. In such an embodiment, the first compensation switching element and the second compensation switching element are connected between a control electrode of the driving switching element and an output electrode of the driving switching element. In such an embodiment, the first compensation switching element and the second compensation switching element are connected to each other in series. In such an embodiment, the driving switching element is a P-type transistor. In such an embodiment, the first compensation switching element is an N-type transistor. In such an embodiment, the second compensation switching element is a P-type transistor.

In an embodiment, the pixel may further include an initialization switching element which applies an initialization voltage to a node connected between the first compensation switching element and the second compensation switching element.

In an embodiment, the pixel may include a first pixel switching element including a control electrode connected to a first node, an input electrode connected to a second node and an output electrode connected to a third node, a second pixel switching element including a control electrode which receives a data write gate signal, an input electrode which receives a data voltage and an output electrode connected to the second node, a first third pixel switching element including a control electrode which receives a compensation gate signal, an input electrode connected to the first node and an output electrode connected to a fourth node, a second third pixel switching element including a control electrode which receives the data write gate signal, an input electrode connected to the fourth node and an output electrode connected to the third node, a fourth pixel switching element including a control electrode which receives a data initialization gate signal, an input electrode which receives a first initialization voltage and an output electrode connected to the fourth node, a fifth pixel switching element including a control electrode which receives an emission signal, an input electrode which receives a first power voltage and an output electrode connected to the second node, a sixth pixel switching element including a control electrode which receives the emission signal, an input electrode connected to the third node and an output electrode connected to an anode electrode of the light emitting element, a seventh pixel switching element including a control electrode which receives a light emitting element initialization gate signal, an input electrode which receives a second initialization voltage and an output electrode connected to the anode electrode of the light emitting element, a storage capacitor including a first electrode which receives the first power voltage and a second electrode connected to the first node and the light emitting element including the anode electrode and a cathode electrode which receives a second power voltage. In such an embodiment, the driving switching element may be the first pixel switching element. In such an embodiment, the first compensation switching element may be the first third pixel switching element. In such an embodiment, the second compensation switching element may be the second third pixel switching element.

In an embodiment, first pixel switching element, the second pixel switching element, the second third pixel switching element, the fourth pixel switching element, the fifth pixel switching element, the sixth pixel switching element and the seventh pixel switching element may be P-type transistors. In such an embodiment, the first third pixel switching element may be the N-type transistor.

According to embodiments of the pixel and the display apparatus including the pixel, when an image displayed on the display panel is a static image or the display panel is operated in always-on mode, the driving frequency of the display panel may be decreased to reduce a power consumption of the display apparatus.

In such embodiments, the first compensation switching element may be an N-type transistor such that the current leakage in the low frequency driving mode may be prevented. Thus, the display quality of the display panel may be enhanced in the low frequency driving mode.

In such embodiments, the second compensation switching element may be a P-type transistor such that the concentration of the electric field in the active area of the driving switching element due to the charging of the electric field at the polyimide layer may be effectively prevented. Accordingly, a photo afterimage generated in a specific region of the display panel due to the change of the characteristic of the driving switching element may be effectively prevented. Thus, the display quality of the display panel may be enhanced.

In such embodiments, the number of the N-type transistors may be reduced in the pixel structure including both the N-type transistor and the P-type transistor such that the resolution characteristic of the pixel may be enhanced and a high frequency characteristic may be enhanced in a high-speed driving mode. In such embodiments, the yield of the display apparatus may be further enhanced.

DETAILED DESCRIPTION

Figure 1:
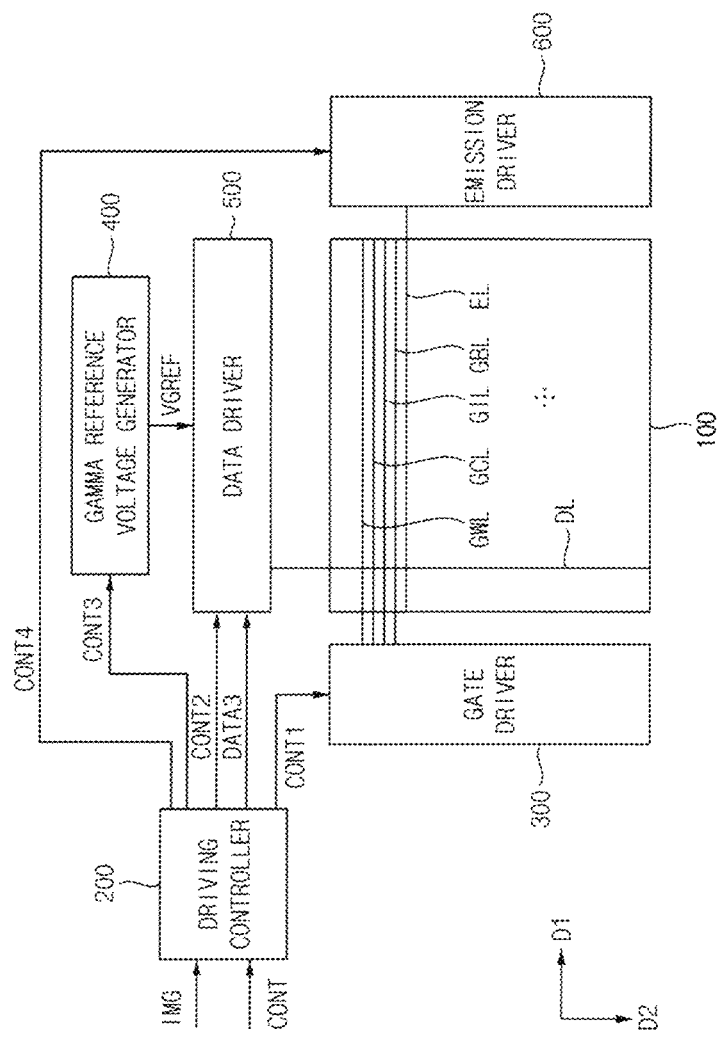
FIG. 1 is a block diagram illustrating a display apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a block diagram illustrating a display apparatus according to an embodiment of the invention.

Referring to FIG. 1, an embodiment of the display apparatus includes a display panel 100 and a display panel driver. The display panel driver includes a driving controller 200, a gate driver 300, a gamma reference voltage generator 400, a data driver 500 and an emission driver 600.

The display panel 100 has a display region on which an image is displayed and a peripheral region adjacent to the display region.

The display panel 100 includes a plurality of gate lines GWL, GCL, GIL and GBL, a plurality of data lines DL, a plurality of emission lines EL and a plurality of pixels electrically connected to the gate lines GWL, GCL, GIL and GBL, the data lines DL and the emission lines EL. The gate lines GWL, GCL, GIL and GBL may extend in a first direction D1, the data lines DL may extend in a second direction D2 crossing the first direction D1, and the emission lines EL may extend in the first direction D1.

The driving controller 200 receives input image data IMG and an input control signal CONT from an external apparatus. In one embodiment, for example, the input image data IMG may include red image data, green image data and blue image data. The input image data IMG may further include white image data. Alternatively, the input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA3 based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA3 based on the input image data IMG. The driving controller 200 outputs the data signal DATA3 to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWL, GCL, GIL and GBL based on the first control signal CONT1 received from the driving controller 200. The gate driver 300 may sequentially output the gate signals to the gate lines GWL, GCL, GIL and GBL.

The gamma reference voltage generator 400 generates a gamma reference voltage VGREF based on the third control signal CONT3 received from the driving controller 200. The gamma reference voltage generator 400 provides the gamma reference voltage VGREF to the data driver 500. The gamma reference voltage VGREF has a value corresponding to a level of the data signal DATA3.

In an embodiment, the gamma reference voltage generator 400 may be disposed in the driving controller 200, or in the data driver 500.

The data driver 500 receives the second control signal CONT2 and the data signal DATA3 from the driving controller 200, and receives the gamma reference voltages VGREF from the gamma reference voltage generator 400.

The data driver 500 converts the data signal DATA3 into data voltages having an analog type using the gamma reference voltages VGREF. The data driver 500 outputs the data voltages to the data lines DL.

The emission driver 600 generates emission signals to drive the emission lines EL based on the fourth control signal CONT4 received from the driving controller 200. The emission driver 600 may output the emission signals to the emission lines EL.

Although an embodiment where the gate driver 300 is disposed at a first side of the display panel 100 and the emission driver 600 is disposed at a second side of the display panel 100 opposite to the first side is shown in FIG. 1 for convenience of illustration and description, the invention may not be limited thereto. In one alternative embodiment, for example, both of the gate driver 300 and the emission driver 600 may be disposed at a same side or the first side of the display panel 100. In one alternative embodiment, for example, the gate driver 300 and the emission driver 600 may be integrally formed with each other, e.g., in a single integrated circuit.

Figure 2:
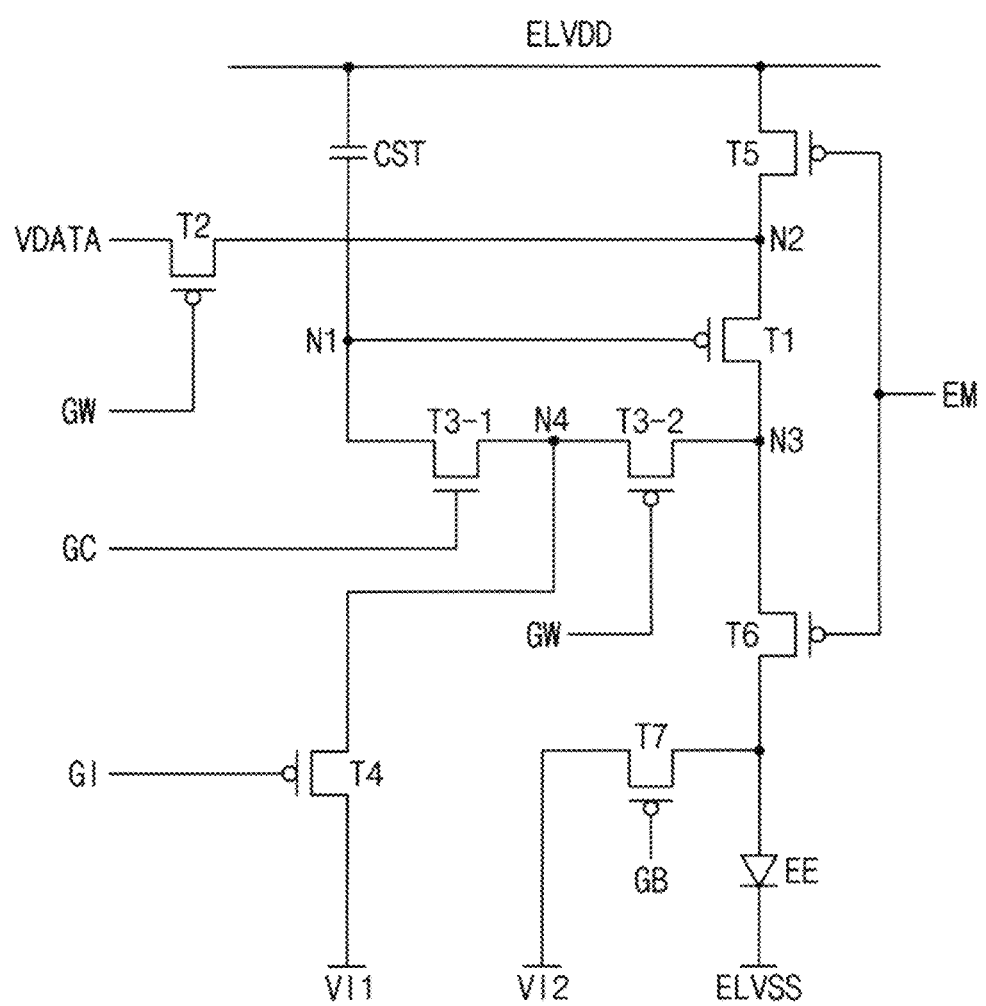
FIG. 2 is a circuit diagram illustrating an embodiment of a pixel of a display panel of FIG. 1.
Figure 3:
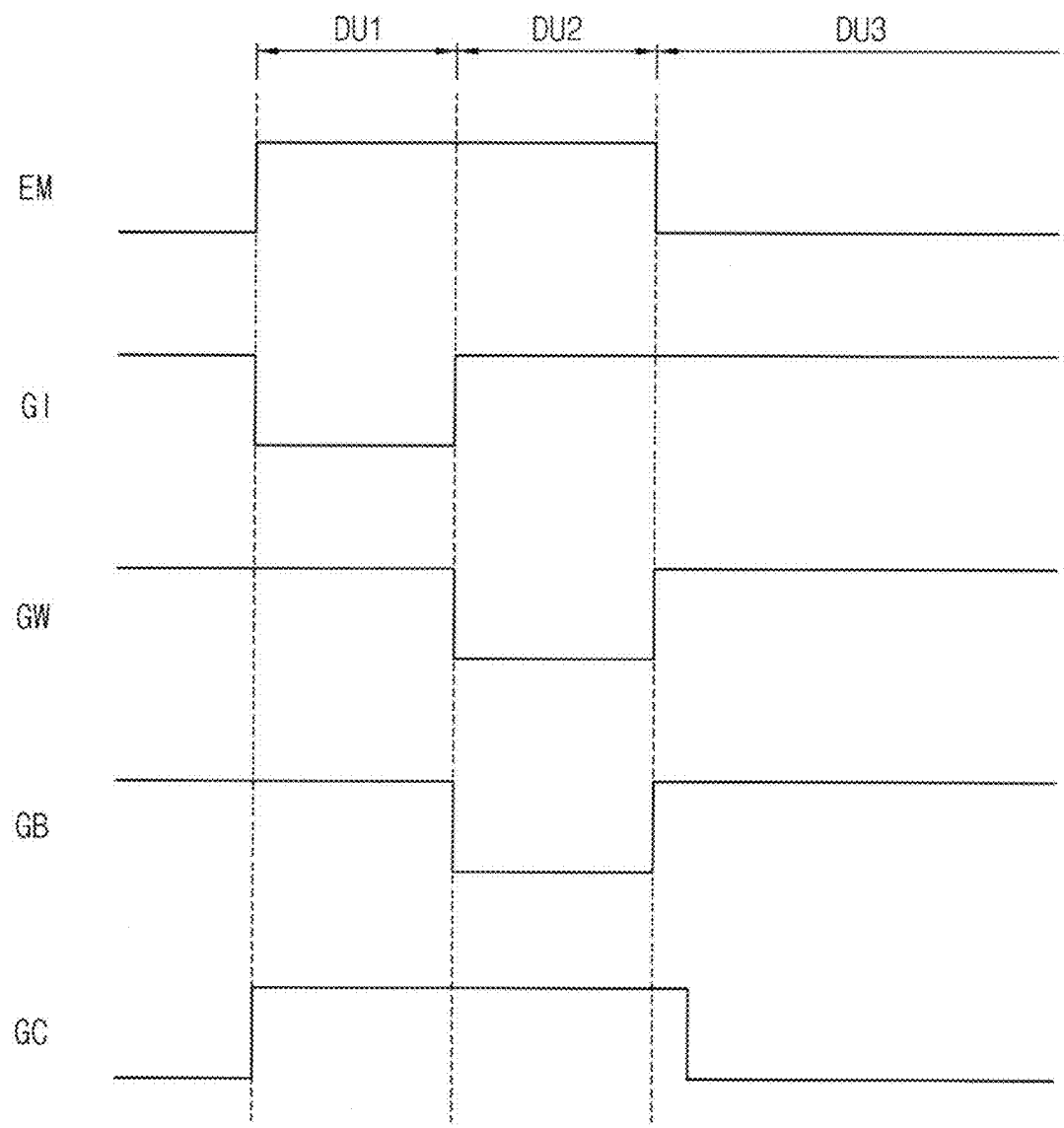
FIG. 3 is a timing diagram illustrating input signals applied to the pixel of FIG. 2.

FIG. 2 is a circuit diagram illustrating an embodiment of a pixel of the display panel 100 of FIG. 1. FIG. 3 is a timing diagram illustrating input signals applied to the pixel of FIG. 2.

Referring to FIGS. 1 to 3, the display panel 100 includes the plurality of the pixels. Each pixel includes a light emitting element EE.

In an embodiment, the pixel receives a data write gate signal GW, a compensation gate signal GC, a data initialization gate signal GI, a light emitting element initialization gate signal GB, the data voltage VDATA and the emission signal EM, and the light emitting element EE of the pixel emits light corresponding to the level of the data voltage VDATA to display the image.

In an embodiment, the pixel may include a switching element of a first type and a switching element of a second type different from the first type. In one embodiment, for example, the switching element of the first type may be a polysilicon thin film transistor. In one embodiment, for example, the switching element of the first type may be a low temperature polysilicon ("LTPS") thin film transistor. In one embodiment, for example, the switching element of the second type may be an oxide thin film transistor. In one embodiment, for example, the switching element of the first type may be a P-type transistor, and the switching element of the second type may be an N-type transistor.

In an embodiment, the pixel may include a driving switching element (e.g. T1), a first compensation switching element (e.g. T3-1) and a second compensation switching element (e.g. T3-2). The driving switching element (e.g. T1) may apply a driving current to the light emitting element EE. The first compensation switching element (e.g. T3-1) and the second compensation switching element (e.g. T3-2) may be disposed between a control electrode of the driving switching element (e.g. T1) and an output electrode of the driving switching element (e.g. T1). The first compensation switching element (e.g. T3-1) and the second compensation switching element (e.g. T3-2) may be connected to each other in series.

In an embodiment, the driving switching element (e.g. T1) may be a P-type transistor. The first compensation switching element (e.g. T3-1) may be an N-type transistor. The second compensation switching element (e.g. T3-2) may be a P-type transistor.

The pixel may further include an initialization switching element (e.g. T4). The initialization switching element (e.g. T4) may apply an initialization voltage (e.g. VI1) to a connecting node between the first compensation switching element (e.g. T3-1) and the second compensation switching element (e.g. T3-2).

In such an embodiment, for example, the pixel may include a first pixel switching element T1, a second pixel switching element T2, a first third pixel switching element T3-1, a second third pixel switching element T3-2, a fourth pixel switching element T4, a fifth pixel switching element T5, a sixth pixel switching element T6 and a seventh pixel switching element T7, a storage capacitor CST and the light emitting element EE.

The first pixel switching element T1 includes a control electrode connected to a first node N1, an input electrode connected to a second node N2 and an output electrode connected to a third node N3. The first pixel switching element T1 may be the driving switching element.

In one embodiment, for example, the first pixel switching element T1 may be the polysilicon thin film transistor. In one embodiment, for example, the first pixel switching element T1 may be the P-type thin film transistor. The control electrode of the first pixel switching element T1 may be a gate electrode, the input electrode of the first pixel switching element T1 may be a source electrode and the output electrode of the first pixel switching element T1 may be a drain electrode.

The second pixel switching element T2 includes a control electrode which receives the data write gate signal GW, an input electrode which receives the data voltage VDATA and an output electrode connected to the second node N2.

In one embodiment, for example, the second pixel switching element T2 may be the polysilicon thin film transistor. In one embodiment, for example, the second pixel switching element T2 may be the P-type thin film transistor. The control electrode of the second pixel switching element T2 may be a gate electrode, the input electrode of the second pixel switching element T2 may be a source electrode and the output electrode of the second pixel switching element T2 may be a drain electrode.

The first third pixel switching element T3-1 includes a control electrode which receives the compensation gate signal GC, an input electrode connected to the first node N1 and an output electrode connected to a fourth node N4. The first third pixel switching element T3-1 may be the first compensation switching element.

In one embodiment, for example, the first third pixel switching element T3-1 may be the oxide thin film transistor. In one embodiment, for example, the first third pixel switching element T3-1 may be the N-type thin film transistor. The control electrode of the first third pixel switching element T3-1 may be a gate electrode, the input electrode of the first third pixel switching element T3-1 may be a source electrode and the output electrode of the first third pixel switching element T3-1 may be a drain electrode.

The second third pixel switching element T3-2 includes a control electrode which receives the data write gate signal GW, an input electrode connected to the fourth node N4 and an output electrode connected to the third node N3. The second third pixel switching element T3-2 may be the second compensation switching element.

In one embodiment, for example, the second third pixel switching element T3-2 may be the polysilicon thin film transistor. In one embodiment, for example, the second third pixel switching element T3-2 may be the P-type thin film transistor. The control electrode of the second third pixel switching element T3-2 may be a gate electrode, the input electrode of the second third pixel switching element T3-2 may be a source electrode and the output electrode of the second third pixel switching element T3-2 may be a drain electrode.

The fourth pixel switching element T4 includes a control electrode which receives the data initialization gate signal GI, an input electrode which receives an initialization voltage (or a first initialization voltage) VI1 and an output electrode connected to the fourth node N4. The fourth pixel switching element T4 may be the initialization switching element.

In one embodiment, for example, the fourth pixel switching element T4 may be the polysilicon thin film transistor. In one embodiment, for example, the fourth pixel switching element T4 may be the P-type thin film transistor. The control electrode of the fourth pixel switching element T4 may be a gate electrode, the input electrode of the fourth pixel switching element T4 may be a source electrode and the output electrode of the fourth pixel switching element T4 may be a drain electrode.

The fifth pixel switching element T5 includes a control electrode which receives the emission signal EM, an input electrode which receives a first power voltage ELVDD and an output electrode connected to the second node N2.

In one embodiment, for example, the fifth pixel switching element T5 may be the polysilicon thin film transistor. In one embodiment, for example, the fifth pixel switching element T5 may be the P-type thin film transistor. The control electrode of the fifth pixel switching element T5 may be a gate electrode, the input electrode of the fifth pixel switching element T5 may be a source electrode and the output electrode of the fifth pixel switching element T5 may be a drain electrode.

The sixth pixel switching element T6 includes a control electrode which receives the emission signal EM, an input electrode connected to the third node N3 and an output electrode connected to an anode electrode of the light emitting element EE.

In one embodiment, for example, the sixth pixel switching element T6 may be the polysilicon thin film transistor. In one embodiment, for example, the sixth pixel switching element T6 may be the P-type thin film transistor. The control electrode of the sixth pixel switching element T6 may be a gate electrode, the input electrode of the sixth pixel switching element T6 may be a source electrode and the output electrode of the sixth pixel switching element T6 may be a drain electrode.

The seventh pixel switching element T7 includes a control electrode which receives the light emitting element initialization gate signal GB, an input electrode which receives a second initialization voltage VI2 and an output electrode connected to the anode electrode of the light emitting element EE. In an embodiment, as shown in FIG. 2, the second initialization voltage VI2 may be applied to the input electrode of the seventh pixel switching element T7, but the invention may not be limited thereto. In an alternative embodiment, the first initialization voltage VI1 may be applied to the input electrode of the seventh pixel switching element T7.

In one embodiment, for example, the seventh pixel switching element T7 may be the polysilicon thin film transistor. In one embodiment, for example, the seventh pixel switching element T7 may be the P-type thin film transistor. The control electrode of the seventh pixel switching element T7 may be a gate electrode, the input electrode of the seventh pixel switching element T7 may be a source electrode and the output electrode of the seventh pixel switching element T7 may be a drain electrode.

The storage capacitor CST includes a first electrode which receives the first power voltage ELVDD and a second electrode connected to the first node N1.

The light emitting element EE includes the anode electrode and a cathode electrode which receives a second power voltage ELVSS.

In an embodiment, as shown in FIG. 3, during a first duration DU1 the emission signal EM may have an inactive level, the data initialization gate signal GI may have an active level, the data write gate signal GW may have an inactive level and the compensation gate signal GC may have an active level.

During a second duration DU2 subsequent to the first duration DU1, the emission signal EM may have the inactive level, the data initialization gate signal GI may have an inactive level, the data write gate signal GW may have an active level and the compensation gate signal GC may have the active level.

In an embodiment, the light emitting element initialization gate signal GB may have a phase same as a phase of the data write gate signal GW.

In one embodiment, for example, an active level of the emission signal EM may be a low level and the inactive level of the emission signal EM may be a high level. The active level of the data initialization gate signal GI may be a low level and the inactive level of the data initialization gate signal GI may be a high level. The active level of the data write gate signal GW may be a low level and the inactive level of the data write gate signal GW may be a high level. The active level of the light emitting element initialization gate signal GB may be a low level and the inactive level of the light emitting element initialization gate signal GB may be a high level. The active level of the compensation gate signal GC may be a high level and an inactive level of the compensation gate signal GC may be a low level. In an embodiment, the emission signal EM, the data initialization gate signal GI, the data write gate signal GW and the light emitting element initialization gate signal GB are control signals of the P-type transistors such that the emission signal EM, the data initialization gate signal GI, the data write gate signal GW and the light emitting element initialization gate signal GB may have the active levels of a low level. In such an embodiment, the compensation gate signal GC is a control signal of the N-type transistor such that the compensation gate signal GC may have the active level of a high level.

During the first duration DU1, the first node N1 and the storage capacitor CST are initialized in response to the data initialization gate signal GI and the compensation gate signal GC. During the second duration DU2, a threshold voltage (|VTH|) of the first pixel switching element T1 is compensated and the data voltage VDATA of which the threshold voltage (|VTH|) is compensated is written to the first node N1 in response to the data write gate signals GW and the compensation gate signal GC. During the second duration DU2, the anode electrode of the light emitting element EE is initialized in response to the light emitting element initialization gate signal GB. During a third duration DU3, the light emitting element EE emit the light in response to the emission signal EM such that the display panel 100 displays the image.

In an embodiment, as shown in FIGS. 2 and 3, an emission off duration of the emission signal EM corresponds to first and second durations DU1 and DU2, but the invention is not limited thereto. In an alternative embodiment, the emission off duration of the emission signal EM may be set to include the data writing duration DU2. In an alternative embodiment, the emission off duration of the emission signal EM may be longer than a sum of the first and second durations DU1 and DU2.

In an embodiment, as shown in FIG. 3, during the first duration DU1, the data initialization gate signal GI and the compensation gate signal GC may have the active levels. The fourth pixel switching element T4 is turned on when the data initialization gate signal GI has the active level and the first third pixel switching element T3-1 is turned on when the compensation gate signal GC has the active level such that the first initialization voltage VI1 may be applied to the first node N1.

During the second duration DU2, the data write gate signal GW and the compensation gate signal GC may have the active levels. When the data write gate signal GW and the compensation gate signal GC have the active levels, the second pixel switching element T2, the first third pixel switching element T3-1 and the second third pixel switching element T3-2 are turned on. In addition, the first pixel switching element T1 is turned on in response to the first initialization voltage VI1.

A voltage which is subtraction an absolute value (|VTH|) of the threshold voltage of the first pixel switching element T1 from the data voltage VDATA may be charged at the first node N1 along a path generated by the first, second, first third and second third pixel switching elements T1, T2, T3-1 and T3-2.

During the second duration DU2, the light emitting element initialization gate signal GB may have the active level. When the light emitting element initialization gate signal GB has the active level, the seventh pixel switching element T7 is turned on such that the second initialization voltage VI2 may be applied to the anode electrode of the light emitting element EE.

During the third duration DU3, the emission signal EM may have the active level. When the emission signal EM has the active level, the fifth pixel switching element T5 and the sixth pixel switching element T6 are turned on. In addition, the first pixel switching element T1 is turned on by the data voltage VDATA.

A driving current flows through the fifth pixel switching element T5, the first pixel switching element T1 and the sixth pixel switching element T6 to drive the light emitting element EE. An intensity of the driving current may be determined by the level of the data voltage VDATA. A luminance of the light emitting element EE is determined by the intensity of the driving current. The driving current ISD flowing through a path from the input electrode to the output electrode of the first pixel switching element T1 may satisfy the following Equation 1.

$$ISD = \frac{1}{2}\mu Cox\frac{W}{L}(VSG - |VTH|)^2 \quad \text{[Equation 1]}$$

In Equation 1, μ denotes a mobility of the first pixel switching element T1. Cox denotes a capacitance per unit area of the first pixel switching element T1. W/L denotes a width to length ratio of the first pixel switching element T1. VSG denotes a voltage between the input electrode N2 of the first pixel switching element T1 and the control node N1 of the first pixel switching element T1. |VTH| denotes the absolute value of the threshold voltage of the first pixel switching element T1.

The voltage VG of the first node N1 after the compensation of the threshold voltage (|VTH|) during the second duration DU2 may satisfy the following Equation 2.

$$VG = VDATA - |VTH| \quad \text{[Equation 2]}$$

When the light emitting element EE emits the light during the third duration DU3, the driving voltage VOV and the driving current ISD may satisfy the following Equations 3 and 4. In Equation 3, VS denotes a voltage of the second node N2.

$$VOV = VS - VG - |VTH| = \quad \text{[Equation 3]}$$
$$ELVDD - (VDATA - |VTH|) - |VTH| = ELVDD - VDATA$$

$$ISD = \frac{1}{2}\mu Cox\frac{W}{L}(ELVDD - VDATA)^2 \quad \text{[Equation 4]}$$

The threshold voltage (|VTH|) is compensated during the second duration DU2, such that the driving current ISD may be determined regardless of the threshold voltage (|VTH|) of the first pixel switching element T1 when the light emitting element EE emits the light during the third duration DU3.

In such an embodiment, when the image displayed on the display panel 100 is a static image or the display panel is operated in always-on mode, a driving frequency of the display panel 100 may be decreased to reduce a power consumption. If all of the switching elements of the pixel of the display panel 100 are polysilicon thin film transistors, a flicker may be generated due to a leakage current of the pixel switching element in the low frequency driving mode. Thus, at least one of the pixel switching elements may be desired to be the oxide thin film transistor. In an embodiment of the invention, the first third pixel switching element T3-1 may be the oxide thin film transistor. In such an embodiment, the first pixel switching element T1, the second pixel switching element T2, the second third pixel switching element T3-2, the fourth pixel switching element T4, the fifth pixel switching element T5, the sixth pixel switching element T6 and the seventh pixel switching element T7 may be the polysilicon thin film transistors.

Figure 4A:
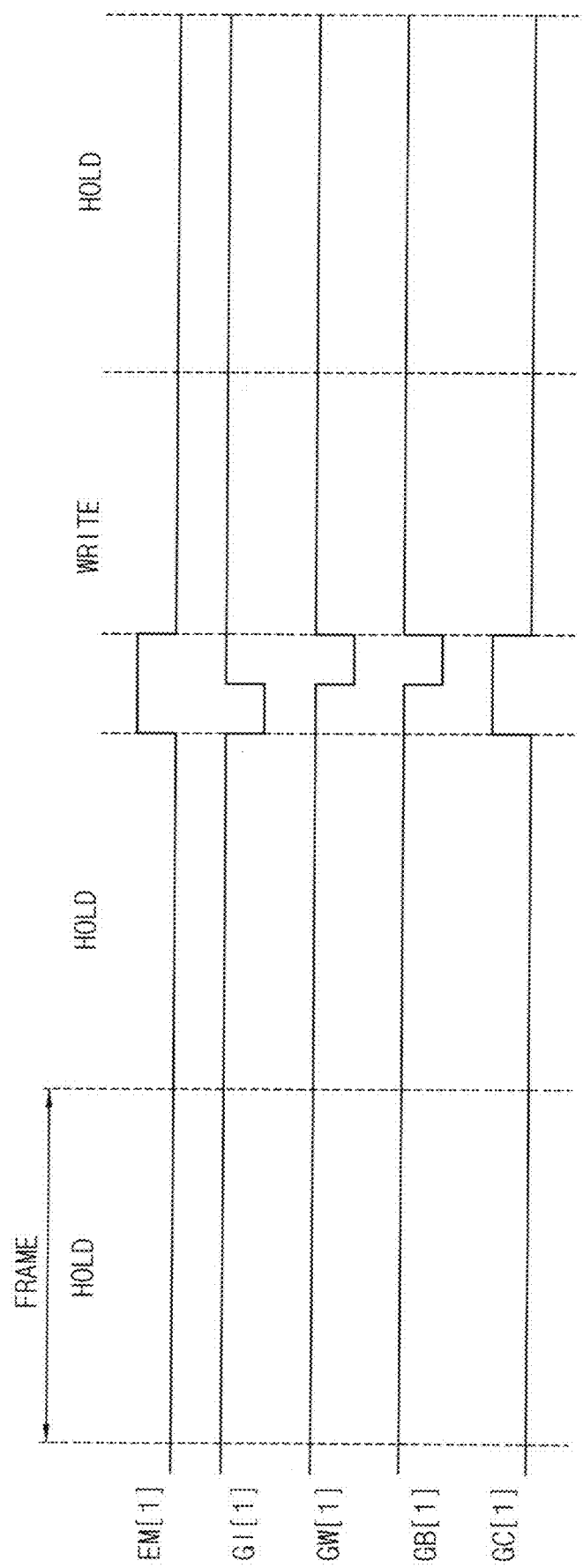
FIG. 4A is a timing diagram illustrating signals applied to the pixels of the display panel of FIG. 2 in a low frequency driving mode.
Figure 4B:
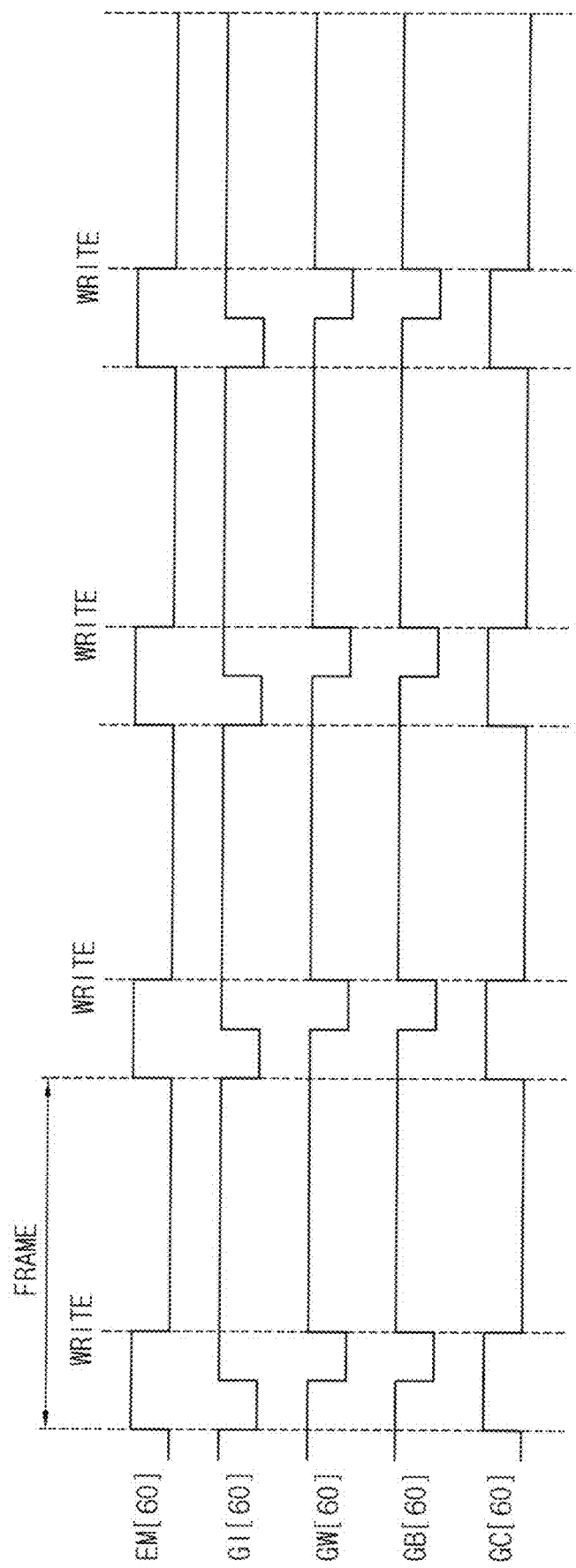
FIG. 4B is a timing diagram illustrating signals applied to the pixels of the display panel of FIG. 2 in a normal driving mode.

FIG. 4A is a timing diagram illustrating signals applied to the pixels of the display panel 100 of FIG. 2 in a low frequency driving mode. FIG. 4B is a timing diagram illustrating signals applied to the pixels of the display panel 100 of FIG. 2 in a normal driving mode.

Referring to FIGS. 1 to 4B, the display panel 100 may be driven in a first mode and a second mode. In the first mode, the display panel driver may drive the pixel switching elements in a low driving frequency. In the second mode, the display panel driver may drive the pixel switching elements in a high driving frequency. The first mode may be the low frequency driving mode. The second mode may be the normal driving mode.

In one embodiment, for example, in the first mode, all of the pixel switching elements may be driven in the low driving frequency. Alternatively, in the first mode, some of the pixel switching elements may be driven in the low driving frequency.

The display panel driver (e.g. the driving controller 200) may analyze the input image. The display panel driver may determine whether the input image is a moving image or a static image.

When the input image is the moving image, the display panel 100 may be driven in the normal driving mode. When the input image is the static image, the display panel 100 may be driven in the low frequency driving mode.

FIG. 4A shows the signals in the low frequency driving mode. In the low frequency driving mode, the emission signal EM[1], the data initialization gate signal GI[1], the data write gate signal GW[1], the light emitting element initialization gate signal GB[1] and the compensation gate signal GC[1] may be driven in the low driving frequency.

In one embodiment, for example, as shown in FIG. 4A, the high driving frequency may be 60 hertz (Hz) and the low driving frequency may be 1 Hz. In such an embodiment, in the low frequency driving mode, a writing operation WRITE is operated in one frame and holding operations HOLD are operated in fifty nine frames during one second.

In one embodiment, for example, when the low driving frequency is 10 Hz, the writing operations WRITE are operated in ten frames and the holding operations HOLD are operated in fifty frames in a second in the low frequency driving mode.

In one embodiment, for example, when the low driving frequency is 30 Hz, the writing operations WRITE are operated in thirty frames and the holding operations HOLD are operated in thirty frames in a second in the low frequency driving mode.

FIG. 4B shows signals in the normal driving mode. In the normal driving mode, the emission signal EM[60], the data initialization gate signal GI[60], the data write gate signal GW[60], the light emitting element initialization gate signal GB[60] and the compensation gate signal GC[60] may be driven in the high driving frequency.

In an embodiment, as shown in FIG. 4B, the high driving frequency may be 60 Hz. In such an embodiment, in the normal driving mode, a writing operation WRITE is operated in every frame.

Figure 5A:
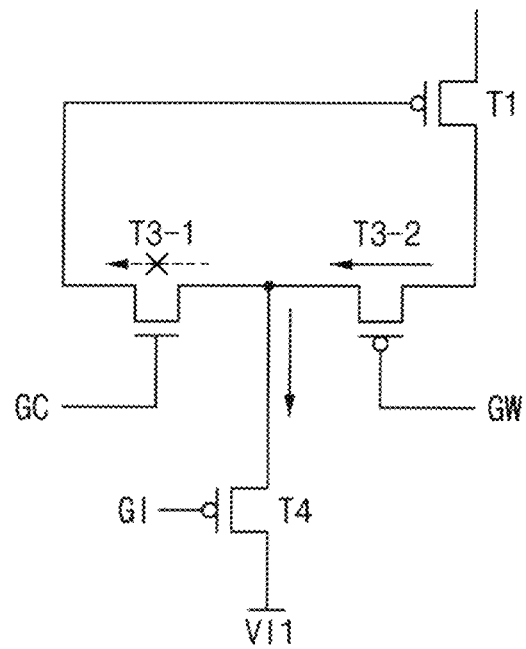
FIG. 5A is a circuit diagram illustrating a current leakage when the pixel of FIG. 2 displays an image of a high grayscale value.
Figure 5B:
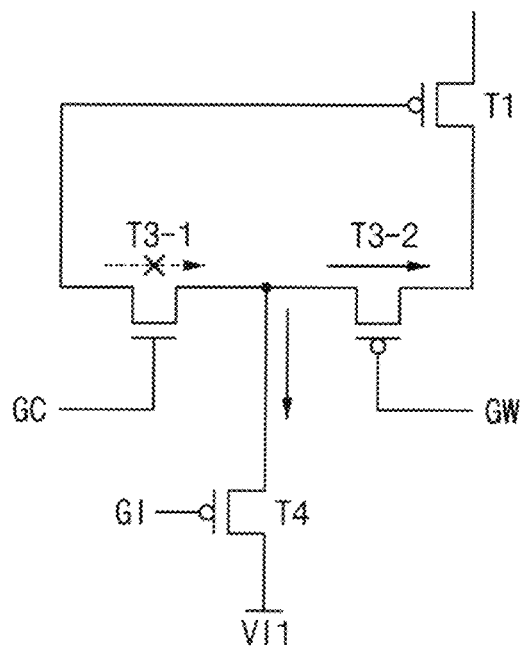
FIG. 5B is a circuit diagram illustrating a current leakage when the pixel of FIG. 2 displays an image of a low grayscale value.

FIG. 5A is a circuit diagram illustrating a current leakage when the pixel of FIG. 2 displays an image of a high grayscale value. FIG. 5B is a circuit diagram illustrating a current leakage when the pixel of FIG. 2 displays an image of a low grayscale value.

Referring to FIGS. 1 to 5B, in an embodiment, the pixel includes the first compensation switching element T3-1 and the second compensation switching element T3-2 which are disposed between the control electrode of the driving switching element T1 and the output electrode of the driving switching element T1 and connected to each other in series. The first compensation switching element T3-1 may be the N-type transistor. The second compensation switching element T3-2 may be the P-type transistor.

FIG. 5A shows a case in which the pixel displays the image of the high grayscale value. When the pixel displays the image of the high grayscale value, a gate voltage of the driving switching element T1 is relatively low such that a current path may be formed from the output electrode of the driving switching element T1 toward the control electrode of the driving switching element T1. In an embodiment, the second compensation switching element T3-2 is the P-type transistor, such that the current leakage of the second compensation switching element T3-2 is relatively great. In such an embodiment, the first compensation switching element T3-1 is the N-type transistor, such that the current leakage of the first compensation switching element T3-1 is relatively little. Since the current leakage of the first compensation switching element T3-1 is relatively little, a level of the gate voltage of the driving switching element T1 may hardly decrease. Thus, even when the pixel is driven in the low driving frequency, the current leakage may be effectively prevented and accordingly, a deterioration of a display quality of the display panel 100 may be effectively prevented.

FIG. 5B shows a case in which the pixel displays the image of the low grayscale value. When the pixel displays the image of the low grayscale value, a gate voltage of the driving switching element T1 is relatively high such that a current path may be formed from the control electrode of the driving switching element T1 toward the output electrode of the driving switching element T1. In an embodiment, the second compensation switching element T3-2 is the P-type transistor, such that the current leakage of the second compensation switching element T3-2 is relatively great. In such an embodiment, the first compensation switching element T3-1 is the N-type transistor, such that the current leakage of the first compensation switching element T3-1 is relatively little. Since the current leakage of the first compensation switching element T3-1 is relatively little, even when the pixel displays the image of the low grayscale value, the level of the gate voltage of the driving switching element T1 may hardly decrease. Thus, even when the pixel is driven in the low driving frequency, the current leakage may be effectively prevented and accordingly, a deterioration of a display quality of the display panel 100 may be effectively prevented.

Figure 6A:
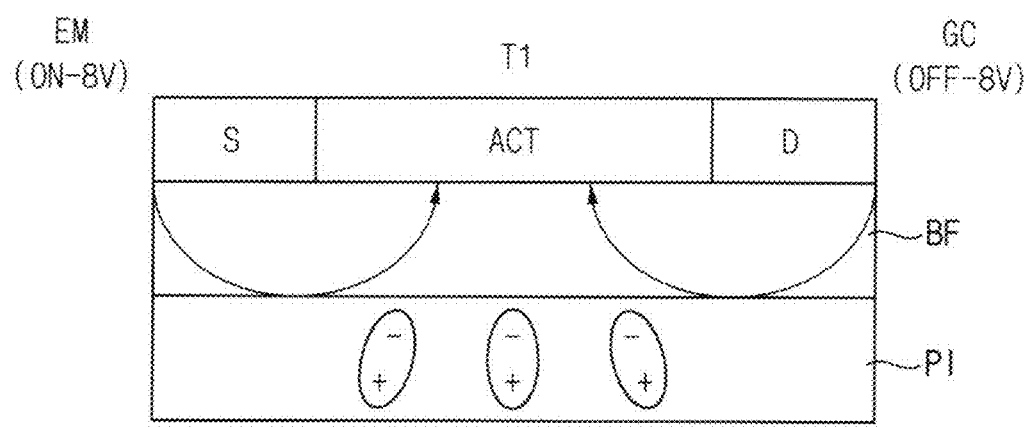
FIG. 6A is a schematic cross-sectional view illustrating an electric field applied to a driving switching element of a comparative embodiment.
Figure 6B:
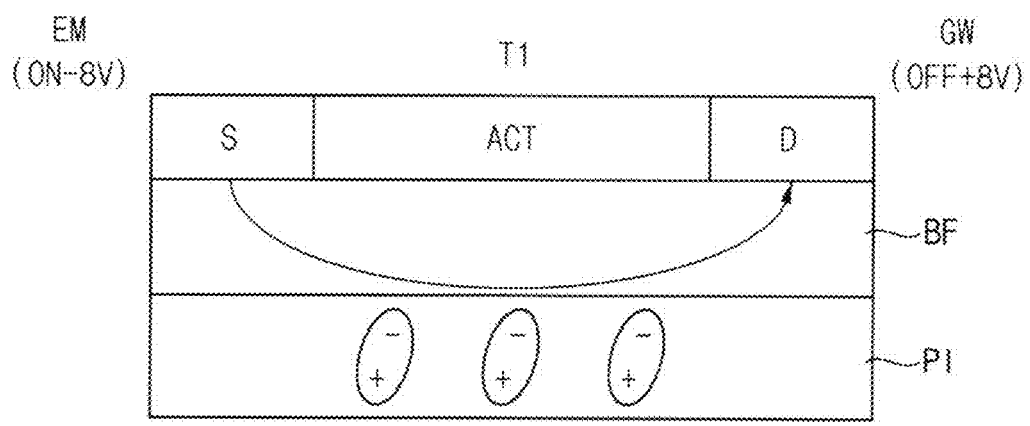
FIG. 6B is a schematic cross-sectional view illustrating an electric field applied to a driving switching element of FIG. 2.

FIG. 6A is a schematic cross-sectional view illustrating an electric field applied to a driving switching element of a comparative embodiment. FIG. 6B is a schematic cross-sectional view illustrating an electric field applied to a driving switching element of FIG. 2.

In the comparative embodiment of FIG. 6A, a compensation switching element disposed adjacent to the output electrode of the driving switching element T1 may be the N-type transistor. In the comparative embodiment, the compensation switching element may receive the compensation gate signal GC.

The pixel P of the display panel 100 has an emission period substantially longer than a non-emission period in a frame period.

Referring to FIG. 6A, in the comparative embodiment, the emission signal EM has the active level (ON, e.g. −8 volts (V)) and the compensation gate signal GC has the inactive level (OFF, e.g. −8 V) in the emission period of the pixel P. The compensation switching element is the N-type transistor such that the inactive level of the compensation gate signal GC may be the low level (e.g. −8 V).

An electric field is formed at a polyimide layer PI by the emission signal EM and the compensation gate signal GC in the emission period of the pixel P. The electric field is also formed at the driving switching element T1 through a buffer layer BF as shown in FIG. 6A. In the comparative embodiment, as shown in FIG. 6A, the electric field is concentrated to the driving switching element T1 such that the characteristic of the driving switching element T1 may be changed. Accordingly, in the comparative embodiment, a photo afterimage may be generated in a specific region of the display panel 100 due to the change of the characteristic of the driving switching element T1.

In an embodiment of the invention, as shown in FIG. 6B, the second compensation switching element T3-2 disposed adjacent to the output electrode of the driving switching element T1 may be the P-type transistor. In such an embodiment, the second compensation switching element T3-2 may receive the data write gate signal GW as shown in FIG. 2.

Referring to FIG. 6B, in such an embodiment, the emission signal EM has the active level (ON, e.g. −8 V) and the data write gate signal GW has the inactive level (OFF, e.g. +8 V) in the emission period of the pixel P. The second compensation switching element T3-2 is the P-type transistor such that the inactive level of the data write gate signal GW may be the high level (e.g. +8 V).

In an embodiment, an electric field is formed at the polyimide layer PI by the emission signal EM and the data write gate signal GW in the emission period of the pixel P. The electric field is also formed at the driving switching element T1 through the buffer layer BF as shown in FIG. 6B. In an embodiment, as shown in FIG. 6B, the electric field is not concentrated to the driving switching element T1 such that the change of the characteristic of the driving switching element T1 may be effectively prevented. Accordingly, a photo afterimage generated in a specific region of the display panel 100 due to the change of the characteristic of the driving switching element T1 may be effectively prevented.

Figure 7:
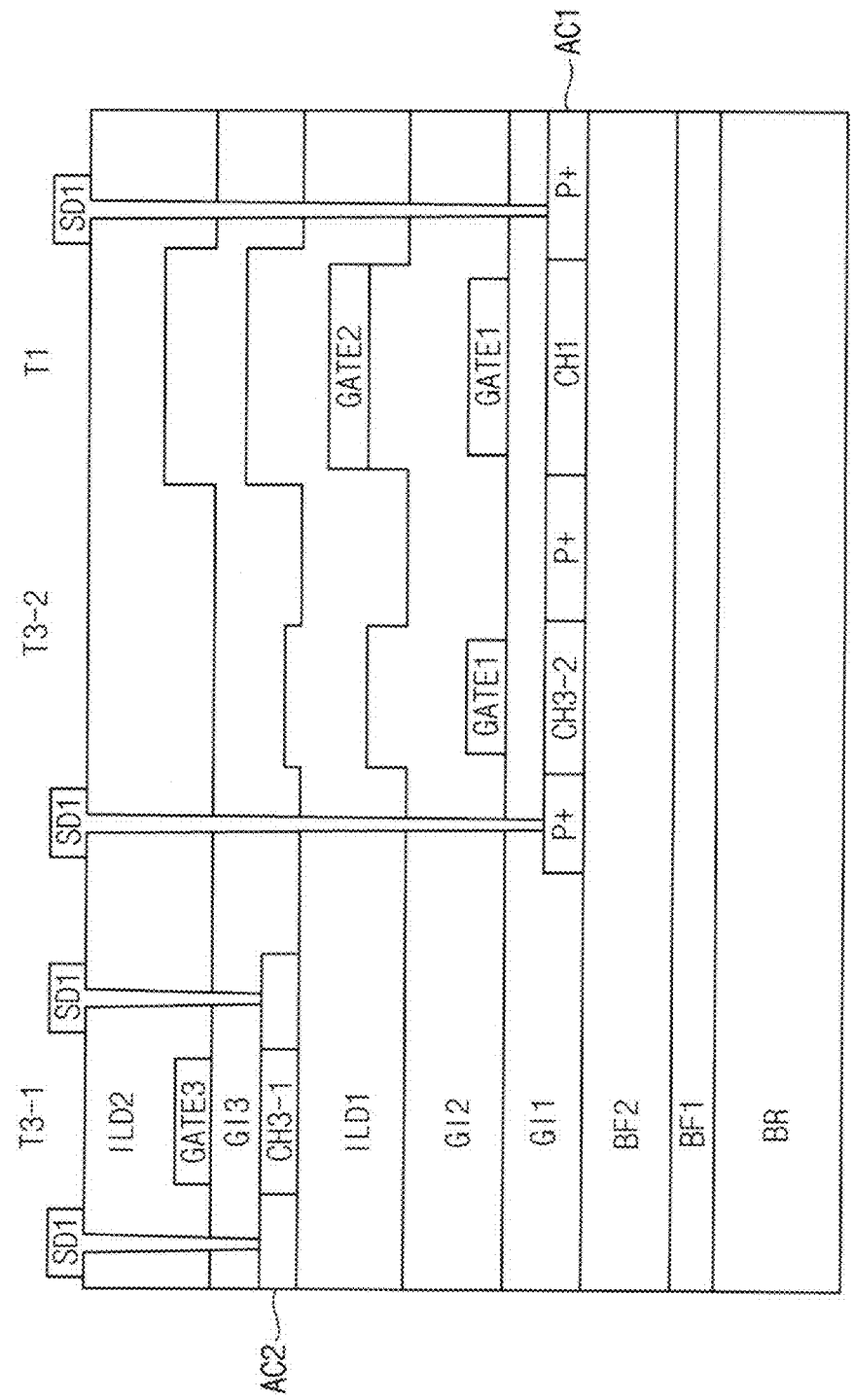
FIG. 7 is a cross-sectional view illustrating a first pixel switching element, a first third pixel switching element and a second third pixel switching element of the pixel of FIG. 2.

FIG. 7 is a cross-sectional view illustrating the first pixel switching element T1, the 3-1 pixel switching element T3-1 and the 3-2 pixel switching element T3-2 of the pixel of FIG. 2.

Referring to FIGS. 1 to 7, in an embodiment, the pixel may include a first active layer AC1, a first gate insulating layer GI1 disposed on the first active layer AC1, a first gate metal layer GATE1 disposed on the first gate insulating layer GI1, a second gate insulating layer GI2 disposed on the first gate metal layer GATE1 to cover the first gate metal layer GATE1, a second gate metal layer GATE2 disposed on the second gate insulating layer GI2, a first interlayer insulating layer ILD1 disposed on the second gate insulating layer GI2 to cover the second gate metal layer GATE2, a second active layer AC2 disposed on the first interlayer insulating layer ILD1, a third gate insulating layer GI3 disposed on the first interlayer insulating layer ILD1 to cover the second active layer AC2, a third gate metal layer GATE3 disposed on the third gate insulating layer GI3 and a second interlayer insulating layer ILD2 disposed on the third gate insulating layer GI3 to cover the third gate metal layer GATE3. A first source-drain metal layer SD1 may be disposed on the second interlayer insulating layer ILD2. The first source-drain metal layer SD1 may be connected or in contact with a doped layer P+ of the first active layer AC1 through a contact hole. In such an embodiment, the first source-drain metal layer SD1 may be connected to or in contact with a doped layer of the second active layer AC2 through a contact hole.

An active area CH1 of the driving switching element T1 may be disposed in or directly on a layer the same (or a same layer) as an active area CH3-2 of the second compensation switching element T3-2. The active area CH1 of the driving switching element T1 may be disposed in or directly on a layer different from an active area CH3-1 of the first compensation switching element T3-1.

In an embodiment, the active area CH1 of the driving switching element T1 and the active area CH3-2 of the second compensation switching element T3-2 may be included in the first active layer AC1. The active area CH3-1 of the first compensation switching element T3-1 may be included in the second active layer AC2.

A portion of the first gate metal layer GATE1 and a portion of the second gate metal layer GATE2 may overlap the active area CH1 of the driving switching element T1 in a thickness direction of the pixel. The portion of the first gate metal layer GATE1 and the portion of the second gate metal layer GATE2 which overlap each other and overlap the active area CH1 of the driving switching element T1 may form the storage capacitor CST.

In an embodiment, the pixel may further include a buffer layer BF2 and BF1 disposed under the first active layer AC1. In an alternative embodiment, the buffer layer BF2 and BF1 may be omitted. In an embodiment, each buffer layer BF2 and BF1 may have a multilayer structure including two or more different layers. The pixel may further include a substrate BR disposed under the buffer layer BF2 and BF1. In one embodiment, for example, the substrate BR may include a polyimide layer and a barrier layer.

According to an embodiment, when an image displayed on the display panel 100 is a static image or the display panel 100 is operated in always-on mode, the driving frequency of the display panel 100 may be decreased to reduce a power consumption of the display apparatus.

In such an embodiment, the first compensation switching element T3-1 may be the N-type transistor such that the current leakage in the low frequency driving mode may be prevented. Thus, the display quality of the display panel 100 may be enhanced in the low frequency driving mode.

In such an embodiment, the second compensation switching element T3-2 may be the P-type transistor such that the concentration of the electric field in the active area of the driving switching element T1 due to the charging of the electric field at the polyimide layer PI may be effectively prevented. Accordingly, a photo afterimage generated in a specific region of the display panel 100 due to the change of the characteristic of the driving switching element T1 may be effectively prevented. Thus, the display quality of the display panel 100 may be enhanced.

In such an embodiment, the number of the N-type transistors may be reduced in the pixel structure including both the N-type transistor and the P-type transistor such that the resolution characteristic of the pixel may be enhanced and a high frequency characteristic may be enhanced in a high-speed driving mode. In such an embodiment, the yield of the display apparatus may be further enhanced.

Figure 8:
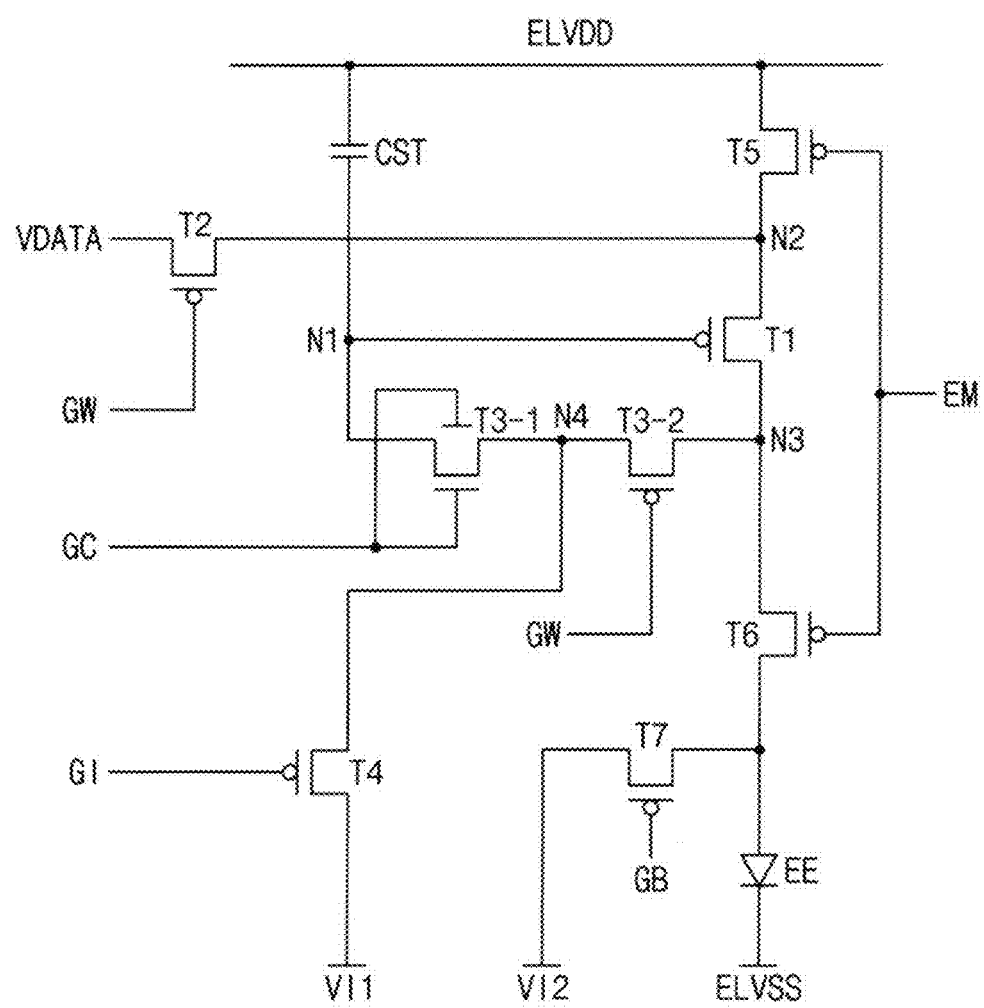
FIG. 8 is a circuit diagram illustrating a pixel of a display panel of a display apparatus according to an embodiment of the invention.
Figure 9:
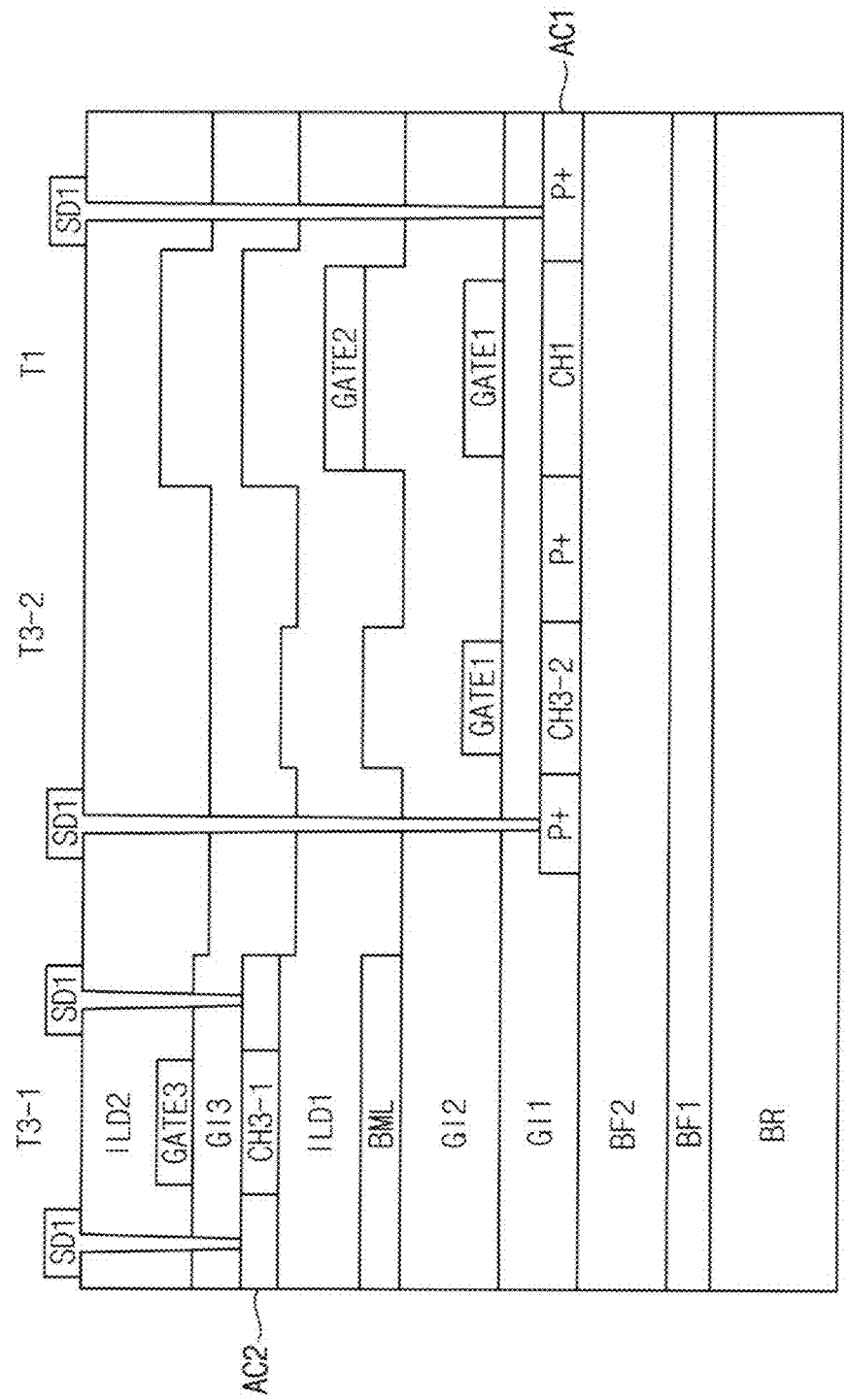
FIG. 9 is a cross-sectional view illustrating a first pixel switching element, a first third pixel switching element and a second third pixel switching element of the pixel of FIG. 8.

FIG. 8 is a circuit diagram illustrating a pixel of a display panel 100 of a display apparatus according to an embodiment of the invention. FIG. 9 is a cross-sectional view illustrating a first pixel switching element T1, a first third pixel switching element T3-1 and a second third pixel switching element T3-2 of the pixel of FIG. 8.

The embodiment of the display apparatus shown in FIGS. 8 and 9 is substantially the same as the embodiments of the display apparatus described above with reference to FIGS. 1 to 7 except for the structure of the pixel. Thus, the same reference numerals will be used to refer to the same or like elements as those in the embodiments of FIGS. 1 to 7, and any repetitive detailed description thereof will be omitted or simplified.

Referring to FIGS. 1, 3 to 6B, 8 and 9, an embodiment of the display apparatus includes a display panel 100 and a display panel driver. The display panel driver includes a driving controller 200, a gate driver 300, a gamma reference voltage generator 400, a data driver 500 and an emission driver 600.

The display panel 100 includes a plurality of pixels. Each pixel includes a light emitting element EE.

The pixel receives a data write gate signal GW, a compensation gate signal GC, a data initialization gate signal GI, a light emitting element initialization gate signal GB, a data voltage VDATA and an emission signal EM and the light emitting element EE of the pixel emits light corresponding to a level of the data voltage VDATA to display the image.

The pixel may include a driving switching element (e.g. T1), a first compensation switching element (e.g. T3-1) and a second compensation switching element (e.g. T3-2). The driving switching element (e.g. T1) may apply a driving current to the light emitting element EE. The first compen-sation switching element (e.g. T3-1) and the second compensation switching element (e.g. T3-2) may be disposed between a control electrode of the driving switching element (e.g. T1) and an output electrode of the driving switching element (e.g. T1). The first compensation switching element (e.g. T3-1) and the second compensation switching element (e.g. T3-2) may be connected to each other in series.

In such an embodiment, the driving switching element (e.g. T1) may be a P-type transistor. The first compensation switching element (e.g. T3-1) may be an N-type transistor. The second compensation switching element (e.g. T3-2) may be a P-type transistor.

In such an embodiment, the first compensation switching element T3-1 includes a gate electrode, a drain electrode, a source electrode and a bottom gate electrode overlapping the gate electrode. The compensation gate signal GC may be commonly applied to the gate electrode and the bottom gate electrode.

In such an embodiment, the first compensation switching element T3-1 further includes the bottom gate electrode BML such that a characteristic and a reliability of the first compensation switching element T3-1 may be further enhanced. In one embodiment, for example, the first compensation switching element T3-1 further includes the bottom gate electrode BML such that a deterioration of the element due to a shift of a threshold voltage of the first compensation switching element T3-1 may be prevented.

The pixel may include a first active layer AC1, a first gate insulating layer GI1 disposed on the first active layer AC1, a first gate metal layer GATE1 disposed on the first gate insulating layer GI1, a second gate insulating layer GI2 disposed on the first gate metal layer GATE1, a second gate metal layer GATE2 disposed on the second gate insulating layer GI2, a first interlayer insulating layer ILD1 disposed on the second gate metal layer GATE2, a second active layer AC2 disposed on the first interlayer insulating layer ILD1, a third gate insulating layer GI3 disposed on the second active layer AC2, a third gate metal layer GATE3 disposed on the third gate insulating layer GI3 and a second interlayer insulating layer ILD2 disposed on the third gate metal layer GATE3.

An active area CH1 of the driving switching element T1 may be disposed in or directly on a layer the same as an active area CH3-2 of the second compensation switching element T3-2. The active area CH1 of the driving switching element T1 may be disposed in or directly on a layer different from an active area CH3-1 of the first compensation switching element T3-1.

In such an embodiment, the gate electrode of the first compensation switching element T3-1 may be included in the third gate metal layer GATE3 and the bottom gate electrode BML of the first compensation switching element T3-1 may be included in the second gate metal layer GATE2.

According to an embodiment, when an image displayed on the display panel 100 is a static image or the display panel 100 is operated in always-on mode, the driving frequency of the display panel 100 may be decreased to reduce a power consumption of the display apparatus.

In such an embodiment, the first compensation switching element T3-1 may be the N-type transistor such that the current leakage in the low frequency driving mode may be prevented. Thus, the display quality of the display panel 100 may be enhanced in the low frequency driving mode.

In such an embodiment, the second compensation switching element T3-2 may be the P-type transistor such that the concentration of the electric field in the active area of the driving switching element T1 due to the charging of the electric field at the polyimide layer PI may be effectively prevented. Accordingly, a photo afterimage generated in a specific region of the display panel 100 due to the change of the characteristic of the driving switching element T1 may be effectively prevented. Thus, the display quality of the display panel 100 may be enhanced.

In such an embodiment, the number of the N-type transistors may be reduced in the pixel structure including both the N-type transistor and the P-type transistor such that the resolution characteristic of the pixel may be enhanced and a high frequency characteristic may be enhanced in a high-speed driving mode. In such an embodiment, the yield of the display apparatus may be further enhanced.

Figure 10:
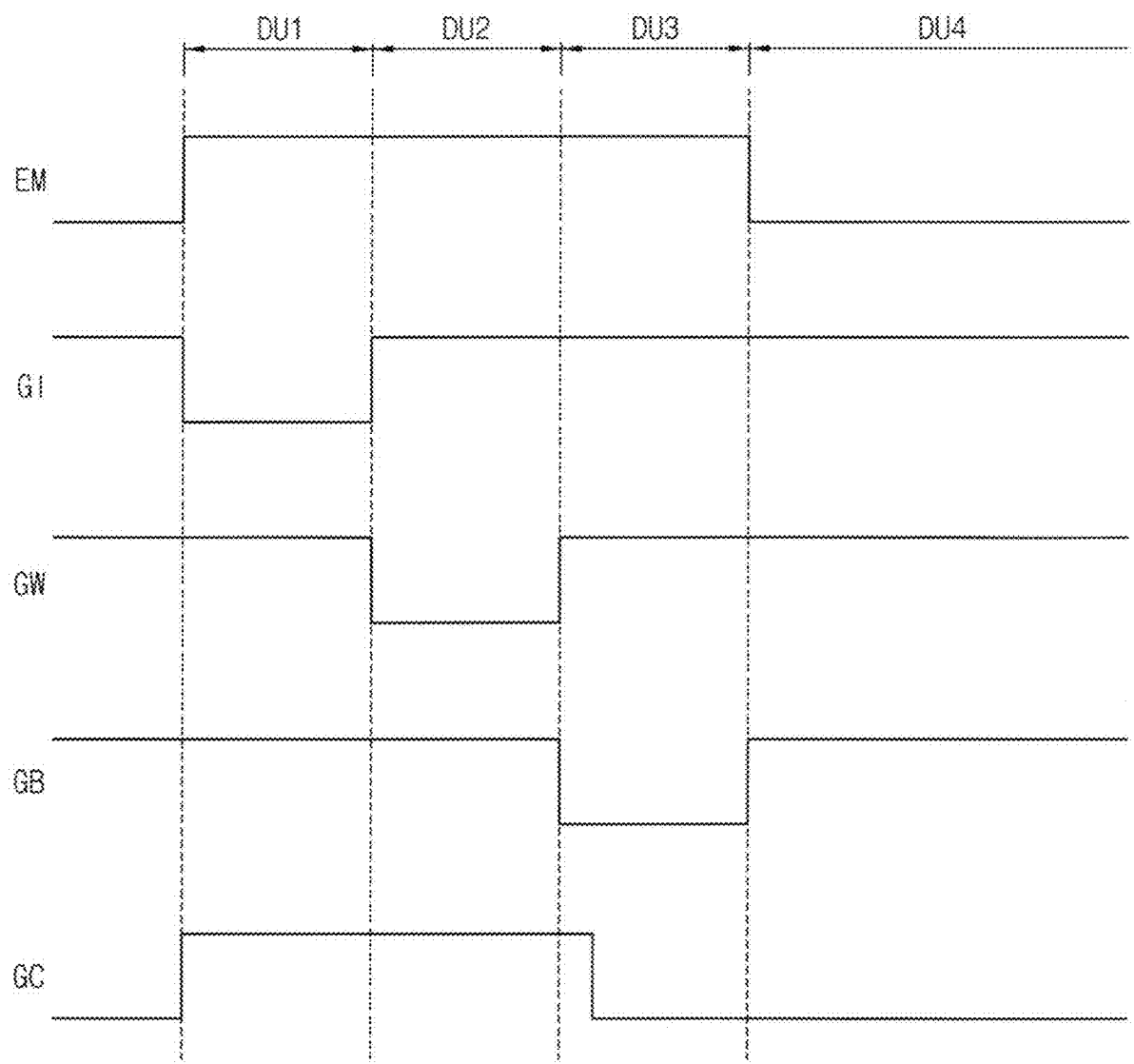
FIG. 10 is a timing diagram illustrating input signals applied to a pixel of a display panel of a display apparatus according to an embodiment of the invention.

FIG. 10 is a timing diagram illustrating input signals applied to a pixel of a display panel 100 of a display apparatus according to an embodiment of the invention.

The embodiment of the display apparatus of FIG. 10 is substantially the same as the embodiments of the display apparatus described above with reference to FIGS. 1 to 7 except for the input signals applied to the pixel. Thus, the same reference numerals will be used to refer to the same or like elements as those of the embodiments of FIGS. 1 to 7, and any repetitive detailed description thereof will be omitted or simplified.

Referring to FIGS. 1, 2, 5A to 6B and 10, an embodiment of the display apparatus includes a display panel 100 and a display panel driver. The display panel driver includes a driving controller 200, a gate driver 300, a gamma reference voltage generator 400, a data driver 500 and an emission driver 600.

The display panel 100 includes a plurality of pixels. Each pixel includes a light emitting element EE.

The pixel receives a data write gate signal GW, a compensation gate signal GC, a data initialization gate signal GI, a light emitting element initialization gate signal GB, a data voltage VDATA and an emission signal EM and the light emitting element EE of the pixel emits light corresponding to a level of the data voltage VDATA to display the image.

The pixel may include a driving switching element (e.g. T1), a first compensation switching element (e.g. T3-1) and a second compensation switching element (e.g. T3-2). The driving switching element (e.g. T1) may apply a driving current to the light emitting element EE. The first compensation switching element (e.g. T3-1) and the second compensation switching element (e.g. T3-2) may be disposed between a control electrode of the driving switching element (e.g. T1) and an output electrode of the driving switching element (e.g. T1). The first compensation switching element (e.g. T3-1) and the second compensation switching element (e.g. T3-2) may be connected to each other in series.

In an embodiment, as shown in FIG. 10, during a first duration DU1, the emission signal EM may have an inactive level, the data initialization gate signal GI may have an active level, the data write gate signal GW may have an inactive level and the compensation gate signal GC may have an active level.

During a second duration DU2 subsequent to the first duration DU1, the emission signal EM may have the inactive level, the data initialization gate signal GI may have an inactive level, the data write gate signal GW may have an active level and the compensation gate signal GC may have the active level.

In such an embodiment, during a third duration DU3 subsequent to the second duration DU2, the emission signal EM may have the inactive level, the data initialization gate signal GI may have the inactive level, the data write gate signal GW may have the inactive level and a light emitting element initialization gate signal GB may have an active level.

In one embodiment, for example, an active level of the emission signal EM may be a low level and the inactive level of the emission signal EM may be a high level. The active level of the data initialization gate signal GI may be a low level and the inactive level of the data initialization gate signal GI may be a high level. The active level of the data write gate signal GW may be a low level and the inactive level of the data write gate signal GW may be a high level. The active level of the light emitting element initialization gate signal GB may be a low level and the inactive level of the light emitting element initialization gate signal GB may be a high level. The active level of the compensation gate signal GC may be a high level and an inactive level of the compensation gate signal GC may be a low level. The emission signal EM, the data initialization gate signal GI, the data write gate signal GW and the light emitting element initialization gate signal GB are control signals of the P-type transistors such that the emission signal EM, the data initialization gate signal GI, the data write gate signal GW and the light emitting element initialization gate signal GB may have the active levels of a low level. In such an embodiment, the compensation gate signal GC is a control signal of the N-type transistor such that the compensation gate signal GC may have the active level of a high level.

During the first duration DU1, the first node N1 and the storage capacitor CST are initialized in response to the data initialization gate signal GI and the compensation gate signal GC. During the second duration DU2, a threshold voltage (|VTH|) of the first pixel switching element T1 is compensated and the data voltage VDATA of which the threshold voltage (|VTH|) is compensated is written to the first node N1 in response to the data write gate signals GW and the compensation gate signal GC. During the third duration DU3, the anode electrode of the light emitting element EE is initialized in response to the light emitting element initialization gate signal GB. During a fourth duration DU4, the light emitting element EE emit the light in response to the emission signal EM such that the display panel 100 displays the image.

According to an embodiment, when an image displayed on the display panel 100 is a static image or the display panel 100 is operated in always-on mode, the driving frequency of the display panel 100 may be decreased to reduce a power consumption of the display apparatus.

In such an embodiment, the first compensation switching element T3-1 may be the N-type transistor such that the current leakage in the low frequency driving mode may be effectively prevented. Thus, the display quality of the display panel 100 may be enhanced in the low frequency driving mode.

In such an embodiment, the second compensation switching element T3-2 may be the P-type transistor such that the concentration of the electric field in the active area of the driving switching element T1 due to the charging of the electric field at the polyimide layer PI may be effectively prevented. Accordingly, a photo afterimage generated in a specific region of the display panel 100 due to the change of the characteristic of the driving switching element T1 may be effectively prevented. Thus, the display quality of the display panel 100 may be enhanced.

Figure 11:
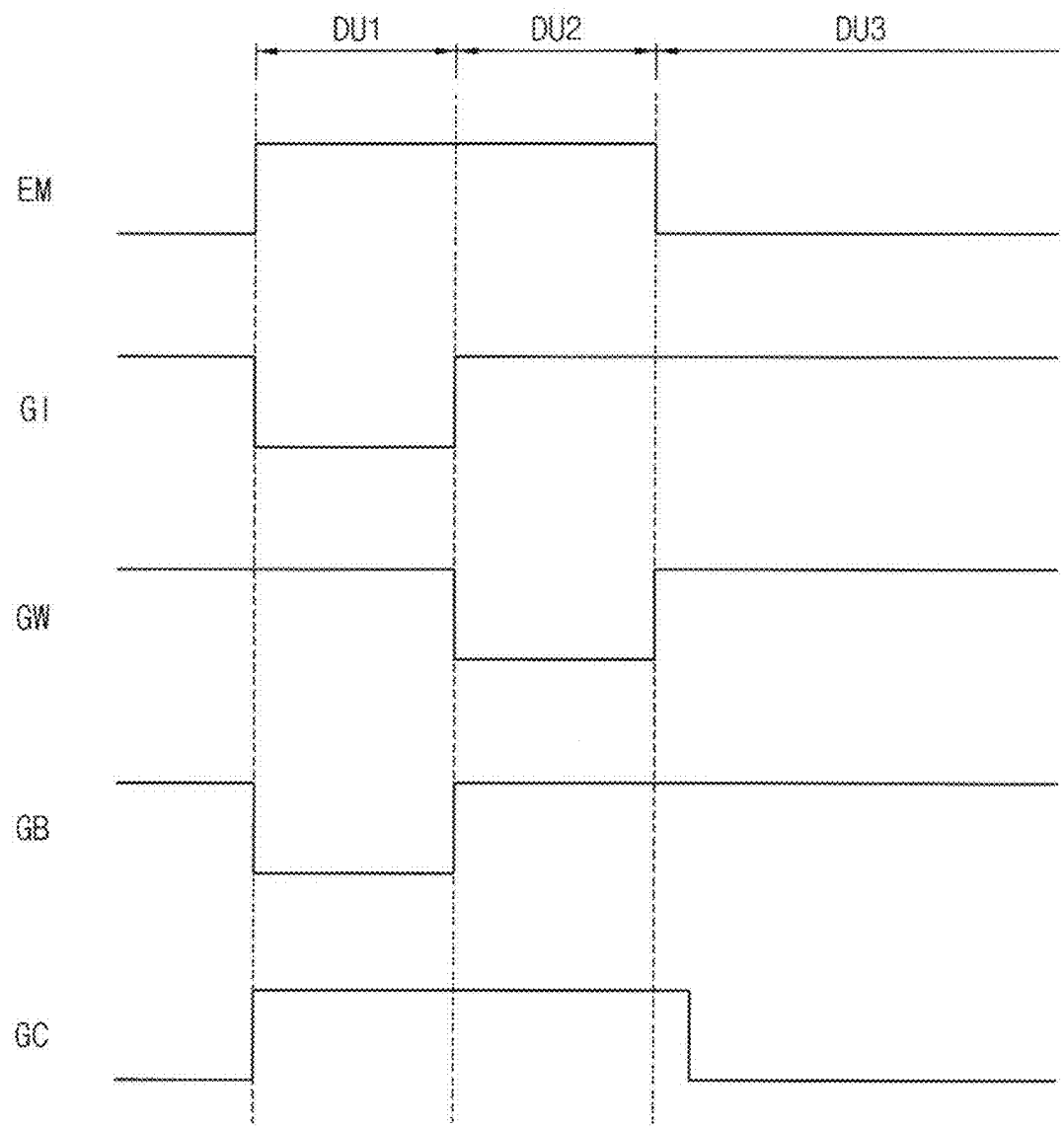
FIG. 11 is a timing diagram illustrating input signals applied to a pixel of a display panel of a display apparatus according to an embodiment of the invention.

FIG. 11 is a timing diagram illustrating input signals applied to a pixel of a display panel 100 of a display apparatus according to an embodiment of the invention.

The embodiment of the display apparatus of FIG. 11 is substantially the same as the embodiments of the display apparatus described above with reference to FIGS. 1 to 7 except for the input signals applied to the pixel. Thus, the same reference numerals will be used to refer to the same or like elements as those of the embodiments of FIGS. 1 to 7 and any repetitive detailed description thereof will be omitted or simplified.

Referring to FIGS. 1, 2, 5A to 6B and 11, an embodiment of the display apparatus includes a display panel 100 and a display panel driver. The display panel driver includes a driving controller 200, a gate driver 300, a gamma reference voltage generator 400, a data driver 500 and an emission driver 600.

The display panel 100 includes a plurality of pixels. Each pixel includes a light emitting element EE.

The pixel receives a data write gate signal GW, a compensation gate signal GC, a data initialization gate signal GI, a light emitting element initialization gate signal GB, a data voltage VDATA and an emission signal EM and the light emitting element EE of the pixel emits light corresponding to a level of the data voltage VDATA to display the image.

The pixel may include a driving switching element (e.g. T1), a first compensation switching element (e.g. T3-1) and a second compensation switching element (e.g. T3-2). The driving switching element (e.g. T1) may apply a driving current to the light emitting element EE. The first compensation switching element (e.g. T3-1) and the second compensation switching element (e.g. T3-2) may be disposed between a control electrode of the driving switching element (e.g. T1) and an output electrode of the driving switching element (e.g. T1). The first compensation switching element (e.g. T3-1) and the second compensation switching element (e.g. T3-2) may be connected to each other in series.

In an embodiment, as shown in FIG. 11, during a first duration DU1, the emission signal EM may have an inactive level, the data initialization gate signal GI may have an active level, the data write gate signal GW may have an inactive level and the compensation gate signal GC may have an active level.

During a second duration DU2 subsequent to the first duration DU1, the emission signal EM may have the inactive level, the data initialization gate signal GI may have an inactive level, the data write gate signal GW may have an active level and the compensation gate signal GC may have the active level.

In such an embodiment, the light emitting element initialization gate signal GB may have a phase the same as a phase of the data initialization gate signal GI.

During the first duration DU1, the first node N1 and the storage capacitor CST are initialized in response to the data initialization gate signal GI and the compensation gate signal GC. During the first duration DU1, the anode electrode of the light emitting element EE is initialized in response to the light emitting element initialization gate signal GB. During the second duration DU2, a threshold voltage (|VTH|) of the first pixel switching element T1 is compensated and the data voltage VDATA of which the threshold voltage (|VTH|) is compensated is written to the first node N1 in response to the data write gate signals GW and the compensation gate signal GC. During a third duration DU3, the light emitting element EE emit the light in response to the emission signal EM such that the display panel 100 displays the image.

According to an embodiment, when an image displayed on the display panel 100 is a static image or the display panel 100 is operated in always-on mode, the driving frequency of the display panel 100 may be decreased to reduce a power consumption of the display apparatus.

In such an embodiment, the first compensation switching element T3-1 may be the N-type transistor such that the current leakage in the low frequency driving mode may be prevented. Thus, the display quality of the display panel 100 may be enhanced in the low frequency driving mode.

In such an embodiment, the second compensation switching element T3-2 may be the P-type transistor such that the concentration of the electric field in the active area of the driving switching element T1 due to the charging of the electric field at the polyimide layer PI may be effectively prevented. Accordingly, a photo afterimage generated in a specific region of the display panel 100 due to the change of the characteristic of the driving switching element T1 may be effectively prevented. Thus, the display quality of the display panel 100 may be enhanced.

Figure 12:
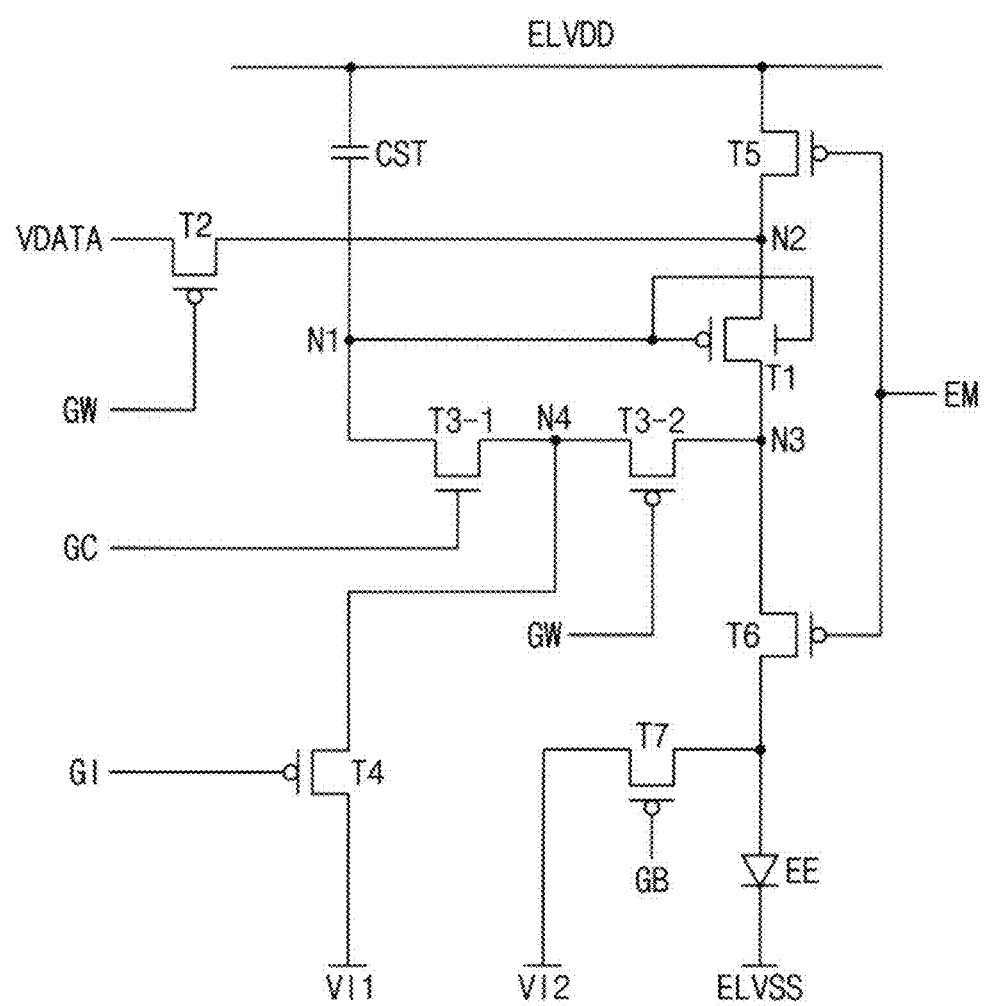
FIG. 12 is a circuit diagram illustrating a pixel of a display panel of a display apparatus according to an embodiment of the invention.

FIG. 12 is a circuit diagram illustrating a pixel of a display panel of a display apparatus according to an embodiment of the invention.

The embodiment of the display apparatus of FIG. 12 is substantially the same as the embodiments of the display apparatus described above with reference to FIGS. 1 to 7 except for the structure of the pixel. Thus, the same reference numerals will be used to refer to the same or like elements as those of the embodiments of FIGS. 1 to 7 and any repetitive detailed description thereof will be omitted or simplified.

Referring to FIGS. 1, 3 to 6B and 12, an embodiment of the display apparatus includes a display panel 100 and a display panel driver. The display panel driver includes a driving controller 200, a gate driver 300, a gamma reference voltage generator 400, a data driver 500 and an emission driver 600.

The display panel 100 includes a plurality of pixels. Each pixel includes a light emitting element EE.

The pixel receives a data write gate signal GW, a compensation gate signal GC, a data initialization gate signal GI, a light emitting element initialization gate signal GB, a data voltage VDATA and an emission signal EM and the light emitting element EE of the pixel emits light corresponding to a level of the data voltage VDATA to display the image.

The pixel may include a driving switching element (e.g. T1), a first compensation switching element (e.g. T3-1) and a second compensation switching element (e.g. T3-2). The driving switching element (e.g. T1) may apply a driving current to the light emitting element EE. The first compensation switching element (e.g. T3-1) and the second compensation switching element (e.g. T3-2) may be disposed between a control electrode of the driving switching element (e.g. T1) and an output electrode of the driving switching element (e.g. T1). The first compensation switching element (e.g. T3-1) and the second compensation switching element (e.g. T3-2) may be connected to each other in series.

In such an embodiment, the driving switching element (e.g. T1) may be a P-type transistor. In such an embodiment, the first compensation switching element (e.g. T3-1) may be an N-type transistor. The second compensation switching element (e.g. T3-2) may be a P-type transistor.

In the embodiment, the driving switching element T1 includes a first gate electrode, a drain electrode, a source electrode and a second gate electrode overlapped with the gate electrode. The first gate electrode and the second gate electrode may be commonly connected to the first node N1.

When the driving switching element T1 includes the first gate electrode and the second gate electrode, the photo afterimage may be further reduced.

According to an embodiment, when an image displayed on the display panel 100 is a static image or the display panel 100 is operated in always-on mode, the driving frequency of the display panel 100 may be decreased to reduce a power consumption of the display apparatus.

In such an embodiment, the first compensation switching element T3-1 may be the N-type transistor such that the current leakage in the low frequency driving mode may be effectively prevented. Thus, the display quality of the display panel 100 may be enhanced in the low frequency driving mode.

In such an embodiment, the second compensation switching element T3-2 may be the P-type transistor such that the concentration of the electric field in the active area of the driving switching element T1 due to the charging of the electric field at the polyimide layer PI may be effectively prevented. Accordingly, a photo afterimage generated in a specific region of the display panel 100 due to the change of the characteristic of the driving switching element T1 may be prevented. Thus, the display quality of the display panel 100 may be enhanced.

In such an embodiment, the number of the N-type transistors may be reduced in the pixel structure including both the N-type transistor and the P-type transistor such that the resolution characteristic of the pixel may be enhanced and a high frequency characteristic may be enhanced in a high-speed driving mode. In such an embodiment, the yield of the display apparatus may be further enhanced.

In embodiments of the display apparatus according to the invention, as described herein, the power consumption of the display apparatus may be reduced and the display quality of the display panel may be enhanced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A pixel comprising:
a light emitting element;
a driving switching element which applies a driving current to the light emitting element;
a first compensation switching element and a second compensation switching element which are connected between a control electrode of the driving switching element and an output electrode of the driving switching element; and
an initialization switching element which applies an initialization voltage to a node connected between the first compensation switching element and the second compensation switching element,
wherein the first compensation switching element and the second compensation switching element are connected to each other in series,
wherein the driving switching element is a P-type transistor,
wherein the first compensation switching element is an N-type transistor, and
wherein the second compensation switching element is a P-type transistor.

2. The pixel of claim 1, wherein the pixel comprises:
a first pixel switching element including a control electrode connected to a first node, an input electrode connected to a second node and an output electrode connected to a third node;
a second pixel switching element including a control electrode which receives a data write gate signal, an input electrode which receives a data voltage and an output electrode connected to the second node;
a first third pixel switching element including a control electrode which receives a compensation gate signal, an input electrode connected to the first node and an output electrode connected to a fourth node;
a second third pixel switching element including a control electrode which receives the data write gate signal, an input electrode connected to the fourth node and an output electrode connected to the third node;
a fourth pixel switching element including a control electrode which receive a data initialization gate signal, an input electrode which receives a first initialization voltage and an output electrode connected to the fourth node;
a fifth pixel switching element including a control electrode which receives an emission signal, an input electrode which receives a first power voltage and an output electrode connected to the second node;
a sixth pixel switching element including a control electrode which receives the emission signal, an input electrode connected to the third node and an output electrode connected to an anode electrode of the light emitting element;
a seventh pixel switching element including a control electrode which receives a light emitting element initialization gate signal, an input electrode which receives a second initialization voltage and an output electrode connected to the anode electrode of the light emitting element;
a storage capacitor including a first electrode which receives the first power voltage and a second electrode connected to the first node; and
the light emitting element including the anode electrode and a cathode electrode which receive a second power voltage,
wherein the driving switching element is the first pixel switching element,
wherein the first compensation switching element is the first third pixel switching element,
wherein the second compensation switching element is the second third pixel switching element, and
wherein the initialization switching element is the fourth pixel switching element.

3. The pixel of claim 2,
wherein the first pixel switching element, the second pixel switching element, the second third pixel switching element, the fourth pixel switching element, the fifth pixel switching element, the sixth pixel switching element and the seventh pixel switching element are P-type transistors, and
wherein the first third pixel switching element is the N-type transistor.

4. The pixel of claim 2,
wherein the first pixel switching element, the second pixel switching element, the second third pixel switching element, the fourth pixel switching element, the fifth pixel switching element, the sixth pixel switching element and the seventh pixel switching element are polysilicon transistors, and
wherein the first third pixel switching element is an oxide transistor.

5. The pixel of claim 2,
wherein during a first duration, the emission signal has an inactive level, the data initialization gate signal has an active level, the data write gate signal has an inactive level and the compensation gate signal has an active level, and
wherein during a second duration subsequent to the first duration, the emission signal has the inactive level, the data initialization gate signal has an inactive level, the data write gate signal has an active level and the compensation gate signal has the active level.

6. The pixel of claim 5,
wherein an active level of the emission signal is a low level,
wherein the active level of the data initialization gate signal is a low level,
wherein the active level of the data write gate signal is a low level, and
wherein the active level of the compensation gate signal is a high level.

7. The pixel of claim 5, wherein the light emitting element initialization gate signal has a phase the same as a phase of the data write gate signal.

8. The pixel of claim 5, wherein during a third duration subsequent to the second duration, the emission signal has the inactive level, the data initialization gate signal has the inactive level, the data write gate signal has the inactive level and the light emitting element initialization gate signal has an active level.

9. The pixel of claim 5, wherein the light emitting element initialization gate signal has a phase the same as a phase of the data initialization gate signal.

10. The pixel of claim 1, wherein the first compensation switching element comprises a gate electrode, a drain electrode, a source electrode and a bottom gate electrode overlapping the gate electrode.

11. The pixel of claim 10, wherein the pixel further comprises:
a first active layer;
a first gate insulating layer disposed on the first active layer;
a first gate metal layer disposed on the first gate insulating layer;
a second gate insulating layer disposed on the first gate metal layer;
a second gate metal layer disposed on the second gate insulating layer;
a first interlayer insulating layer disposed on the second gate metal layer;
a second active layer disposed on the first interlayer insulating layer;
a third gate insulating layer disposed on the second active layer;
a third gate metal layer disposed on the third gate insulating layer; and
a second interlayer insulating layer disposed on the third gate metal layer,
wherein the gate electrode of the first compensation switching element is included in the third gate metal layer, and
wherein the bottom gate electrode of the first compensation switching element is included in the second gate metal layer.

12. The pixel of claim 1, wherein the driving switching element comprises a first gate electrode, a drain electrode, a source electrode and a second gate electrode.

13. A pixel comprising:
a light emitting element;
a driving switching element which applies a driving current to the light emitting element; and
a first compensation switching element and a second compensation switching element which are connected between a control electrode of the driving switching element and an output electrode of the driving switching element,
wherein the first compensation switching element and the second compensation switching element are connected to each other in series,
wherein the driving switching element is a P-type transistor,
wherein the first compensation switching element is an N-type transistor,
wherein the second compensation switching element is a P-type transistor,
wherein an active area of the driving switching element is disposed in a same layer as an active area of the second compensation switching element, and
wherein the active area of the driving switching element is disposed in a layer different from an active area of the first compensation switching element.

14. The pixel of claim 13, wherein the pixel further comprises:
a first active layer;
a first gate insulating layer disposed on the first active layer;
a first gate metal layer disposed on the first gate insulating layer;
a second gate insulating layer disposed on the first gate metal layer;
a second gate metal layer disposed on the second gate insulating layer;
a first interlayer insulating layer disposed on the second gate metal layer;
a second active layer disposed on the first interlayer insulating layer;
a third gate insulating layer disposed on the second active layer;
a third gate metal layer disposed on the third gate insulating layer; and
a second interlayer insulating layer disposed on the third gate metal layer,
wherein the active area of the driving switching element and the active area of the second compensation switching element are included in the first active layer, and
wherein the active area of the first compensation switching element is included in the second active layer.

15. The pixel of claim 13, wherein a portion of the first gate metal layer and a portion of the second gate metal layer overlap the active area of the driving switching element.

16. A display apparatus comprising:
a display panel comprising a pixel;
a gate driver which provides a gate signal to the pixel;
a data driver which provides a data voltage to the pixel; and
an emission driver which provides an emission signal to the pixel,
wherein the pixel comprises:
a light emitting element;
a driving switching element which applies a driving current to the light emitting element;
a first compensation switching element and a second compensation switching element which are connected between a control electrode of the driving switching element and an output electrode of the driving switching element; and
an initialization switching element which applies an initialization voltage to a node connected between the first compensation switching element and the second compensation switching element,
wherein the first compensation switching element and the second compensation switching element are connected to each other in series,
wherein the driving switching element is a P-type transistor,
wherein the first compensation switching element is an N-type transistor,
wherein the second compensation switching element is a P-type transistor.

17. The display apparatus of claim 16, wherein the pixel comprises:
a first pixel switching element including a control electrode connected to a first node, an input electrode connected to a second node and an output electrode connected to a third node;
a second pixel switching element including a control electrode which receives a data write gate signal, an input electrode which receives the data voltage and an output electrode connected to the second node;
a first third pixel switching element including a control electrode which receives a compensation gate signal, an input electrode connected to the first node and an output electrode connected to a fourth node;
a second third pixel switching element including a control electrode which receives the data write gate signal, an input electrode connected to the fourth node and an output electrode connected to the third node;
a fourth pixel switching element including a control electrode which receives a data initialization gate signal, an input electrode which receives a first initialization voltage and an output electrode connected to the fourth node;
a fifth pixel switching element including a control electrode which receives the emission signal, an input electrode which receives a first power voltage and an output electrode connected to the second node;
a sixth pixel switching element including a control electrode which receives the emission signal, an input electrode connected to the third node and an output electrode connected to an anode electrode of the light emitting element;
a seventh pixel switching element including a control electrode which receive a light emitting element initialization gate signal, an input electrode which receives a second initialization voltage and an output electrode connected to the anode electrode of the light emitting element;
a storage capacitor including a first electrode which receives the first power voltage and a second electrode connected to the first node; and
the light emitting element including the anode electrode and a cathode electrode which receives a second power voltage,
wherein the driving switching element is the first pixel switching element,
wherein the first compensation switching element is the first third pixel switching element, wherein the second compensation switching element is the second third pixel switching element, and wherein the initialization switching element is the fourth pixel switching element.

18. The display apparatus of claim 17, wherein the first pixel switching element, the second pixel switching element, the second third pixel switching element, the fourth pixel switching element, the fifth pixel switching element, the sixth pixel switching element and the seventh pixel switching element are P-type transistors, and wherein the first third pixel switching element is the N-type transistor.

* * * * *